US012805294B2

(12) United States Patent
Lin et al.

(10) Patent No.: US 12,805,294 B2
(45) Date of Patent: Nov. 17, 2026

(54) INTEGRATED CIRCUIT DEVICE WITH LOCAL INTERCONNECT FOR POWER DELIVERY

(71) Applicant: TAIWAN SEMICONDUCTOR MANUFACTURING COMPANY, LTD., Hsinchu (TW)

(72) Inventors: Chun-Yen Lin, Hsinchu (TW); Wei-Cheng Tzeng, Hsinchu (TW); Wei-Cheng Lin, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 534 days.

(21) Appl. No.: 18/343,339

(22) Filed: Jun. 28, 2023

(65) Prior Publication Data

US 2024/0290719 A1 Aug. 29, 2024

Related U.S. Application Data

(60) Provisional application No. 63/486,739, filed on Feb. 24, 2023.

(51) Int. Cl.

| | |
|---|---|
| ***H10W 20/41*** | (2026.01) |
| ***G06F 30/392*** | (2020.01) |
| ***H10D 86/00*** | (2025.01) |

(52) U.S. Cl.

CPC ........ *H10W 20/427* (2026.01); *G06F 30/392* (2020.01); *H10D 86/00* (2025.01)

(58) Field of Classification Search

CPC ............... H01L 23/5286; H01L 23/485; H01L 23/5386; G06F 30/392; G06F 30/394; H10D 86/00; H10D 89/10; H10D 84/85

See application file for complete search history.

(56) References Cited

U.S. PATENT DOCUMENTS

| | | | | |
|---|---|---|---|---|
| 2020/0135718 | A1* | 4/2020 | Liebmann | H10D 88/00 |
| 2021/0118798 | A1* | 4/2021 | Liebmann | H10W 20/427 |
| 2022/0310598 | A1 | 9/2022 | Wu et al. | |
| 2023/0042567 | A1* | 2/2023 | Xie | H10D 84/038 |
| 2024/0047455 | A1* | 2/2024 | Li | H10D 88/00 |

FOREIGN PATENT DOCUMENTS

| | | |
|---|---|---|
| TW | 202025444 | 7/2020 |
| TW | 202034494 | 9/2020 |
| TW | 202209572 | 3/2022 |
| WO | 2020092361 | 5/2020 |

* cited by examiner

*Primary Examiner* — Eliseo Ramos Feliciano

*Assistant Examiner* — Sophia W Kao

(74) *Attorney, Agent, or Firm* — Hauptman Ham, LLP

(57) ABSTRACT

An integrated circuit (IC) device includes a complementary field-effect transistor (CFET) device, a power rail at a first side of the CFET device, and a conductor at a second side of the CFET device. The CFET device includes a local interconnect. The first side is one of a front side and a back side of the CFET device. The second side is the other of the front side and the back side of the CFET device. The local interconnect of the CFET device electrically couples the power rail to the conductor.

20 Claims, 17 Drawing Sheets

INTEGRATED CIRCUIT DEVICE WITH LOCAL INTERCONNECT FOR POWER DELIVERY

RELATED APPLICATION(S)

This application claims the benefit of U.S. Provisional Application No. 63/486,739, filed Feb. 24, 2023, which is herein incorporated by reference in its entirety.

BACKGROUND

An integrated circuit ("IC") device includes one or more semiconductor devices represented in an IC layout diagram (also referred to as "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

To reduce the sizes of IC devices, sometimes a layer of semiconductor devices is formed, or bonded, over another layer of semiconductor devices. Examples include complementary field effect transistor (CFET) devices in which an upper or top semiconductor device overlies a lower or bottom semiconductor device in a stack configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
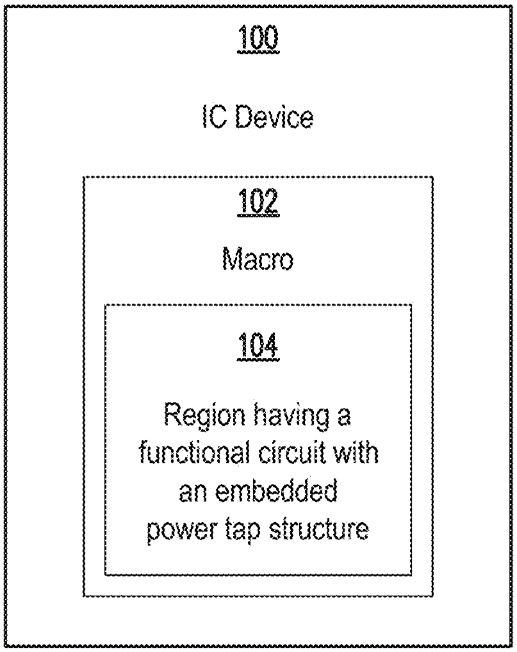
FIG. 1 is a block diagram of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an IC device includes a power delivery structure configured to provide various power supply voltages, e.g., a positive power supply voltage VDD and a reference voltage such as the ground voltage VSS, to various circuits and/or circuit components of the IC device. The power delivery structure is arranged at both a front side and an opposite, back side of the IC device, and comprises one or more power tap structures configured to provide power from one of the front side and the back side to the other side. A chip area occupied by power tap structures or power tap cells is sometimes referred to as a power tap area.

In some embodiments, a power tap structure is embedded in a functional circuit. In at least one embodiment, a power tap structure is configured by one or more local interconnects of one or more CFET devices. In some embodiments, a power tap cell is embedded in a functional cell. As a result, in one or more embodiments, the power tap area of the IC device is advantageously reduced. In some embodiments, a dielectric material, e.g., a low-k material, is formed around a local interconnect of a CFET device configured as a power tap structure. As a result, in one or more embodiments, it is possible to reduce the impact of parasitic capacitance associated with the local interconnect.

FIG. 1 is a block diagram of an IC device 100, in accordance with some embodiments.

In FIG. 1, the IC device 100 comprises, among other things, a macro 102. In some embodiments, the macro 102 comprises one or more of a memory, a power grid, a cell or cells, an inverter, a latch, a buffer and/or any other type of circuit arrangement that may be represented digitally in a cell library. In some embodiments, the macro 102 is understood in the context of an analogy to the architectural hierarchy of modular programming in which subroutines/procedures are called by a main program (or by other subroutines) to carry out a given computational function. In this context, the IC device 100 uses the macro 102 to perform one or more given functions. Accordingly, in this context and in terms of architectural hierarchy, the IC device 100 is analogous to the main program and the macro 102 is analogous to subroutines/procedures. In some embodiments, the macro 102 is a soft macro. In some embodiments, the macro 102 is a hard macro. In some embodiments, the macro 102 is a soft macro which is described digitally in register-transfer level (RTL) code. In some embodiments, synthesis, placement and routing have yet to have been performed on the macro 102 such that the soft macro can be synthesized, placed and routed for a variety of process nodes. In some embodiments, the macro 102 is a hard macro which is described digitally in a binary file format (e.g., Graphic Database System II (GDSII) stream format), where the binary file format represents planar geometric shapes, text labels, other information and the like of one or more layout-diagrams of the macro 102 in hierarchical form. In some embodiments, synthesis, placement and routing have been performed on the macro 102 such that the hard macro is specific to a particular process node.

The macro 102 includes a region 104 which comprises a functional circuit with a power tap structure embedded therein. In some embodiments, the region 104 comprises a substrate having circuitry formed thereon, in a front-end-of-line (FEOL) fabrication. Furthermore, above and/or below (e.g., on a front side and/or a back side of) the substrate, the region 104 comprises various metal layers that are stacked over and/or under insulating layers in a Back End of Line (BEOL) fabrication. The BEOL provides a power network and/or routing for circuitry of the IC device 100, including the macro 102 and the region 104.

Figure 2:
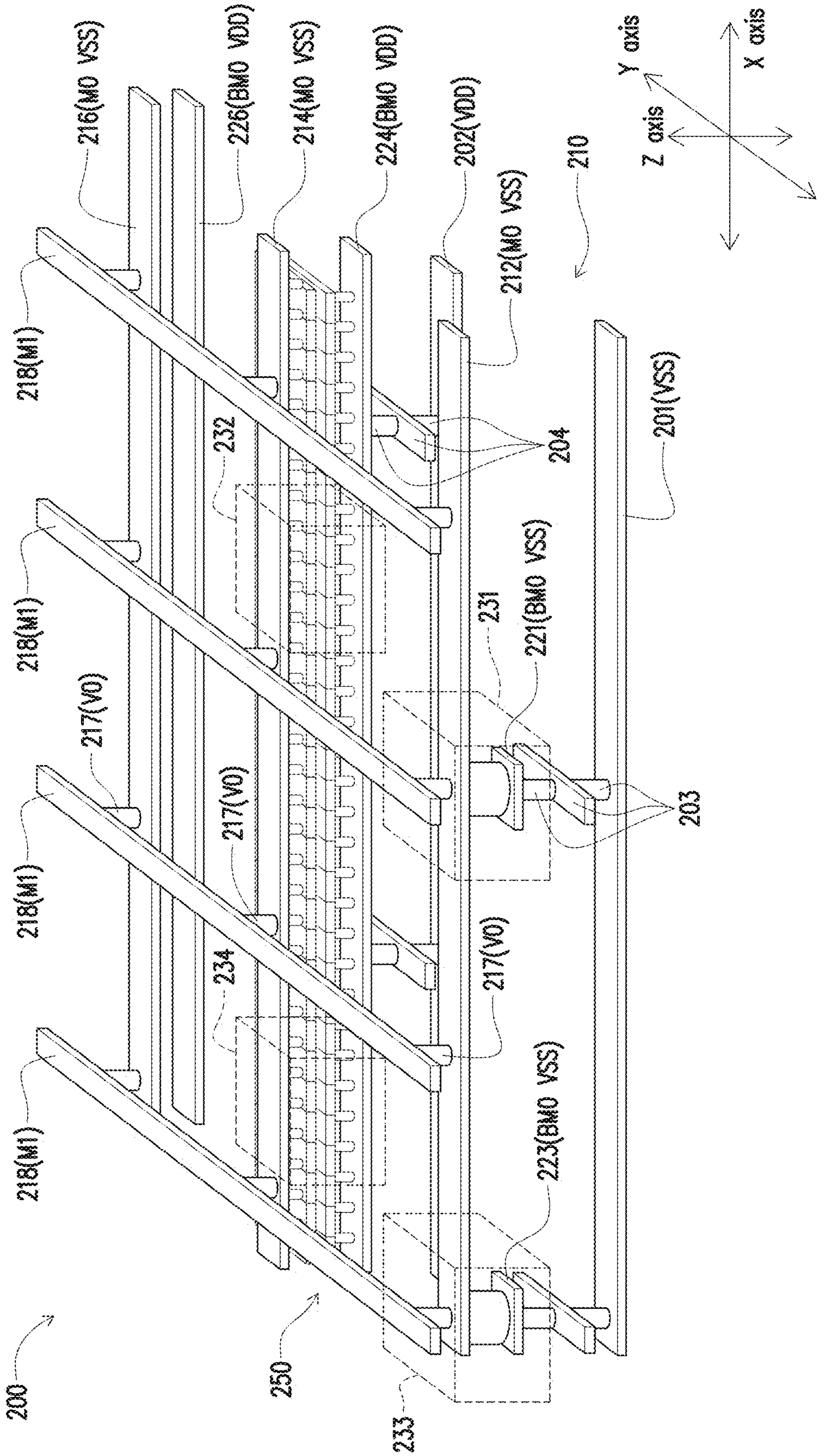
FIG. 2 is a schematic perspective view of an IC device, in accordance with some embodiments.

FIG. 2 is a schematic perspective view of an IC device 200, in accordance with some embodiments. In at least one embodiment, the IC device 200 corresponds to the IC device 100 and/or includes a circuit region corresponding to the region 104 in FIG. 1. For simplicity, some components of the IC device 200 are omitted or schematically illustrated in FIG. 2. Various components of an IC device are described with respect to FIGS. 4A-4B.

The IC device 200 comprises a power delivery structure 210, and at least one functional circuit 250 coupled to and powered by power delivered through the power delivery structure 210. The power delivery structure 210 comprises a back side power delivery network schematically represented by a first power rail 201 and a second power rail 202, a plurality of front side power rails 212, 214, 216, a plurality of back side power rails 224, 226, and a plurality of power tap structures 231-234.

The power delivery network is arranged on a back side of the IC device 200 which further includes a front side opposite to the back side in a thickness direction (e.g., a Z axis) of the IC device 200. In some embodiments, the front side and back side of the IC device 200 correspond to a front side and a back side of the functional circuit 250, and/or to a front side and a back side of a substrate (not shown) on which the functional circuit 250 is arranged. In at least one embodiment, the front side is one of a first side and a second side, and the back side is the other of the first side and the second side. The power delivery network comprises a plurality of back side metal layers and back side via layers as described herein, and is configured to receive power from a power supply, and deliver the received power to the functional circuit 250. The power supply provides a first power supply voltage, and a second power supply voltage different from the first power supply voltage. The first power rail 201 of the power delivery network is configured to receive the first power supply voltage, and deliver the first power supply voltage to the front side power rail 212 through the back side metal layers and via layers schematically designated at 203, and the power tap structures 231, 233. The second power rail 202 of the power delivery network is configured to receive the second power supply voltage, and deliver the second power supply voltage to the back side power rail 224 through the back side metal layers and via layers schematically designated at 204. In the example configuration in FIG. 2, the first power supply voltage is VSS and the second power supply voltage is VDD. Other configurations where the first power supply voltage is VDD and the second power supply voltage is VSS within the scopes of various embodiments. Power rails configured to receive and deliver VSS are sometimes referred to herein as VSS power rails, and power rails configured to receive and deliver VDD are sometimes referred to herein as VDD power rails. In some embodiments, the power delivery network comprises multiple VSS power rails and multiple VDD power rails alternatingly arranged in a direction (e.g., Y axis) transverse to a lengthwise direction (e.g., X axis) of the VSS power rails and VDD power rails.

The front side power rails 212, 214, 216 are configured to carry the first power supply voltage. In the example configuration in FIG. 2, the first power supply voltage is VSS, and the front side power rails 212, 214, 216 are VSS power rails arranged in a front side M0 layer. The IC device 200 further comprises other front side metal layers, such as, M1, M2, or the like, and front side via layers, such as V0, V1, or the like, as described herein. The VSS power rail 212 is electrically coupled by V0 vias, such as 217, and M1 conductive patterns, such as 218, to deliver VSS received from the VSS power rail 201 on the back side to the VSS power rails 214, 216. In some embodiments, one or more of the VSS power rails 214, 216 is configured to receive VSS from a VSS power rail similar to the VSS power rail 201. For example, as illustrated in FIG. 2, the VSS power rail 214 is configured to receive VSS from the back side through the power tap structures 232, 234. Other configurations are within the scopes of various embodiments.

The back side power rails 224, 226 are configured to carry the second power supply voltage. In the example configuration in FIG. 2, the second power supply voltage is VDD, and the back side power rails 224, 226 are VDD power rails arranged in a back side BM0 layer. The IC device 200 further comprises other back side metal layers, such as, BM1, BM2, or the like, and back side via layers, such as BV0, BV1, or the like, as described herein. In some embodiments, the VDD power rail 226 is configured to receive VDD from the VDD power rail 224. In at least one embodiment, the VDD power rail 226 is configured to receive VDD from a VDD power rail similar to the VDD power rail 202.

The functional circuit 250 is arranged between the VSS power rails 212, 214, 216 and the VDD power rails 224, 226 in the thickness direction (e.g., the Z axis) of the IC device 200. The functional circuit 250 is electrically coupled to and powered by one or more of the VSS power rails 212, 214, 216 and one or more of the VDD power rails 224, 226. In the example configuration in FIG. 2, the functional circuit 250 comprises a plurality of semiconductor devices coupled to the VDD power rail 224 and/or the VSS power rail 214. The functional circuit 250, powered by VDD and VSS, is configured to perform one or more functions of the IC device 200. In some embodiments, the functional circuit 250 comprises one or more active devices, passive devices, logic circuits, or the like. Examples of logic circuits include, but are not limited to, AND, OR, NAND, NOR, XOR, INV, AND-OR-Invert (AOI), OR-AND-Invert (OAI), MUX, Flip-flop, BUFF, Latch, delay, clock, memory, or the like. Example memory cells include, but are not limited to, a static random access memory (SRAM), a dynamic RAM (DRAM), a resistive RAM (RRAIVI), a magnetoresistive RAM (MRAM), a read only memory (ROM), or the like. Examples of active devices or active elements include, but are not limited to, transistors, diodes, or the like. Examples of passive elements include, but are not limited to, capacitors, inductors, fuses, resistors, or the like. In some embodiments, a functional circuit of an IC device corresponds to a functional cell, or a set of functional cells, placed in a layout diagram of the IC device, as described herein.

The power tap structures 231-234 are each configured to electrically couple a corresponding front side power rail to a conductor on the back side, e.g., a back side conductive pattern or a back side power rail. For example, the power tap structure 231 electrically couples the VSS power rail 212 on the front side to a BM0 conductive pattern 221 on the back side. The BM0 conductive pattern 221 is electrically coupled to the VSS power rail 201 of the power delivery network, to deliver VSS to the VSS power rail 212 through the power tap structure 231. Similarly, the power tap structure 233 electrically couples the VSS power rail 212 on the front side to a BM0 conductive pattern 223 on the back side. The BM0 conductive pattern 223 is electrically coupled to the VSS power rail 201 of the power delivery network, to deliver VSS to the VSS power rail 212 through the power tap structure 233. In the example configuration in FIG. 2, the BM0 conductive pattern 221 is physically separated from the BM0 conductive pattern 223. In some embodiments, the BM0 conductive pattern 221 and BM0 conductive pattern 223 are integral parts of a further back side power rail, e.g., a VSS power rail, in the BM0 layer. In some embodiments, the BM0 layer comprises multiple VSS power rails arranged alternatingly with the VDD power rails 224, 226. The power tap structures 232, 234 are configured to provide electrical connections similar to those described with respect to the power tap structures 231, 233.

At least one of the power tap structures 231-234 is in a functional circuit. In the example configuration in FIG. 2, the power tap structures 232, 234 are included in the functional circuit 250. In some embodiments, the power tap structures 232, 234 comprise local interconnects of CFET devices in the functional circuit 250. In at least one embodiment, the power tap structures 232, 234 correspond to power tap cells embedded in functional cells corresponding to the functional circuit 250. In some embodiments, the functional circuit 250 includes a single power tap structure, e.g., either of the power tap structures 232, 234 is omitted. In some embodiments, at least one of the power tap structures 231, 233 is included in a functional circuit in a manner similar to the power tap structures 232, 234 being included in the functional circuit 250. In at least one embodiment, at least one of the power tap structures 231, 233 is an independent power tap structure not included in a functional circuit. For example, an independent power tap structure corresponds to an independent power tap cell not embedded in a functional cell. In some embodiments, power tap structures, including those included in functional circuits and/or independent power tap structures, are distributed uniformly, or substantially uniformly, across a chip area of the IC device 200.

In at least one embodiment, as described herein, the inclusion of one or more power tap structures in one or more functional circuits of an IC device, or the inclusion of one or more power tap cells in one or more functional cells of a layout diagram of an IC device, makes it possible to advantageously reduce the power tap area and/or to free routing recourses for signals within or between the functional circuits.

Figure 3A:
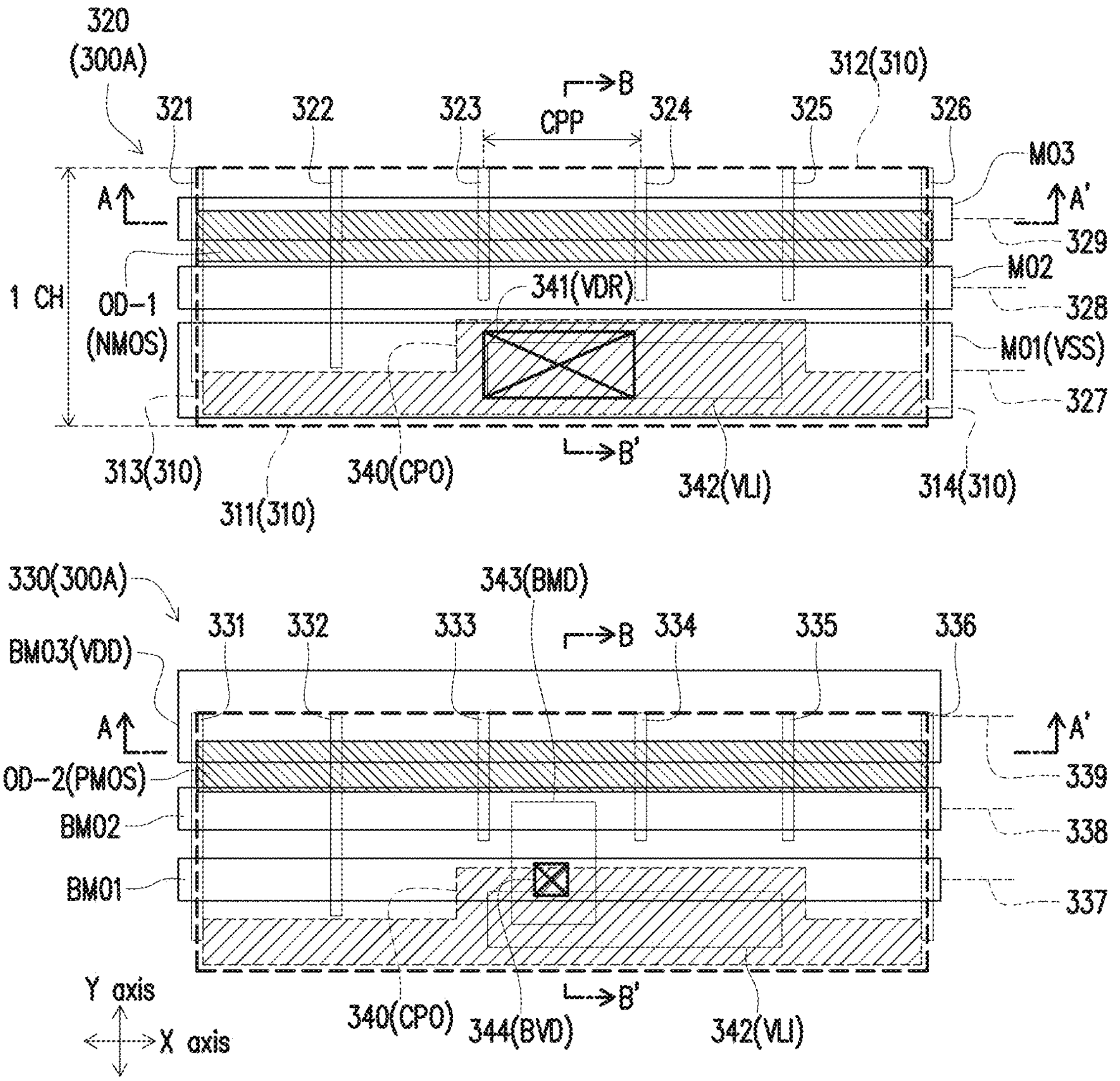
FIG. 3A includes schematic views at various layers of a layout diagram of a circuit region of an IC device, in accordance with some embodiments.

FIG. 3A includes schematic views at various layers of a layout diagram 300A of a circuit region of an IC device, in accordance with some embodiments. In some embodiments, the circuit region corresponds to a portion of the region 104 in FIG. 1 and/or to a portion of the IC device 200. In some embodiments, the circuit region is a cell, and the layout diagram 300A is a layout of the cell. In at least one embodiment, the layout diagram 300A is stored as a standard cell in at least one library on a non-transitory computer-readable recording medium, and is read out and placed into a layout diagram of an IC device to be designed and/or manufactured.

In the example configuration in FIG. 3A, the circuit region corresponding to the layout diagram 300A comprises CFET devices each comprising a top semiconductor device and a bottom semiconductor device. The layout diagram 300A comprises a top layer (or upper layer) 320 corresponding to one or more top semiconductor devices, and a bottom layer (or lower layer) 330 corresponding to one or more bottom semiconductor devices.

The layout diagram 300A comprises a boundary 310 which is the same for the top layer 320 and the bottom layer 330. In at least one embodiment, the circuit region is a cell and the boundary 310 is a cell boundary. Examples of cells include, but are not limited to, AND, OR, NAND, NOR, XOR, INV, OR-AND-Invert (OAI), MUX, Flip-flop, BUFF, Latch, delay, clock, memory such as static random-access memory (SRAM), de-coupling capacitor, analog amplifier, logic driver, digital driver, or the like. The boundary 310 comprises edges 311, 312, 313, 314. The edges 311, 312 are elongated along the X axis, and the edges 313, 314 are elongated along the Y axis. In some embodiments, the X axis is an example of one of a first direction and a second direction, and the Y axis is an example of the other of the first direction and the second direction. The edges 311, 312, 313, 314 are connected together to form the closed boundary 310. In a place-and-route operation (also referred to as "automated placement and routing (APR)") described herein, cells are placed in an IC layout diagram in abutment with each other at their respective boundaries. The boundary 310 is sometimes referred to as "place-and-route boundary" or "prBoundary." The rectangular shape of the boundary 310 is an example. Other boundary shapes for various cells are within the scope of various embodiments.

The top layer 320 comprises a layout of one or more top semiconductor devices of a first type, and the bottom layer 330 comprises a layout of corresponding one or more bottom semiconductor devices of a second type different from the first type. In some embodiments, the first type is one of a P-type and an N-type, and the second type is the other of the P-type and N-type.

Each of the top layer 320 and bottom layer 330 comprises at least one active region. Active regions are sometimes referred to as oxide-definition (OD) regions or source/drain regions, and are schematically illustrated in the drawings with the label "OD." For example, the top layer 320 comprises an active region OD-1, and the bottom layer 330 comprises an active region OD-2. In the layout diagram 300A, the active regions OD-1, OD-2 overlap each other, or are stacked one over another, along a thickness direction of a substrate as described herein, and are commonly referred to as an active region OD.

In at least one embodiment, the active regions OD-1, OD-2 are over a first side, or a front side, of the substrate as described herein. The active regions OD-1, OD-2 are elongated along the X axis. The active regions OD-1, OD-2 include P-type dopants and/or N-type dopants to form one or more circuit elements or semiconductor devices. Examples of circuit elements include, but are not limited to, transistors and diodes. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. An active region configured to form one or more PMOS devices is sometimes referred to as "PMOS active region," and an active region configured to form one or more NMOS devices is sometimes referred to as "NMOS active region." In the example configuration described with respect to FIG. 3A, the active region OD-1 comprises an NMOS active region, and the active region OD-2 comprise a PMOS active region. In some embodiments, the active region OD-1 comprises a PMOS active region, and the active region OD-2 comprise an NMOS active region.

The top layer 320 further comprises a plurality of gate regions 321-326, and the bottom layer 330 further comprises a plurality of corresponding gate regions 331-336. In the layout diagram 300A, the gate regions 321-326 correspondingly overlap, or are correspondingly stacked over, the gate regions 331-336 along the thickness direction of the substrate as described herein. In some embodiments, one or more of the gate regions 321-326 is electrically coupled to, or made integral with, the corresponding, underlying one or more of the gate regions 331-336. In some embodiments, one or more of the gate regions 321-326 is physically separated, and electrically disconnected, from the corresponding, underlying one or more of the gate regions 331-336.

The gate regions 321-326 and gate regions 331-336 are correspondingly over the active regions OD-1, OD-2. The gate regions 321-326, 331-336 are elongated along the Y axis. The gate regions 321-326 are arranged along the X axis at a regular pitch designated at CPP (contacted poly pitch) in FIG. 3A. Likewise, the gate regions 331-336 are arranged along the X axis at a regular pitch CPP. CPP is a center-to-center distance along the X axis between two directly adjacent gate regions. Two gate regions are considered directly adjacent (or immediately adjacent) where there are no other gate regions therebetween. CFET devices corresponding to immediately adjacent gate regions are considered as immediately adjacent CFET devices. A width (or cell pitch) of the circuit region (or cell) in the layout diagram 300A along the X axis is 5 CPPs in the example configuration in FIG. 3A. Gates corresponding to the gate regions 321-326, 331-336 comprise a conductive material, such as, polysilicon, which is sometimes referred to as "poly." Other conductive materials for gates, such as metals, are within the scope of various embodiments. Gate regions are sometimes schematically illustrated in the drawings with the label "PO."

In the example configuration in FIG. 3A, the gate regions 322-325, 332-335 are functional gate regions which, together with the active regions OD-1, OD-2, configure a plurality of semiconductor devices or transistors, as described herein. In some embodiments, the gate regions 321, 326, 331, 336 are non-functional, or dummy, gate regions. Dummy gate regions are not configured to form transistors together with the underlying active regions, and/or one or more transistors formed by dummy gate regions together with the underlying active regions are not electrically coupled to other circuitry in the circuit region of the layout diagram 300A and/or the IC device corresponding to the layout diagram 300A. In at least one embodiment, non-functional or dummy gates corresponding to dummy gate regions include dielectric material in a manufactured IC device. Other configurations are within the scopes of various embodiments. For example, in one or more embodiments, at least one of the gate regions 322-325, 332-335 is a dummy gate region, and/or at least one of the gate regions 321, 326, 331, 336 is a functional gate region.

The edge 313 of the boundary 310 coincides with centerlines of the gate regions 321, 331. The edge 314 of the boundary 310 coincides with centerlines of the gate regions 326, 336. Between the edges 311, 312 and along the Y axis, the circuit region of the layout diagram 300A contains one NMOS active region, i.e., OD-1, and one PMOS active region, i.e., OD-2, and is considered to have a height corresponding to one cell height CH. Another cell or circuit region containing along the Y axis two PMOS active regions and two NMOS active regions is considered to have a height corresponding to a double cell height 2 CH, or the like.

The top layer 320 further comprises a plurality of semiconductor devices configured by the gate regions 322-325 and the active region OD-1. The bottom layer 330 further comprises a plurality of semiconductor devices configured by the gate regions 332-335 and the active region OD-2. For simplicity, a semiconductor device or transistor is referred herein by the same reference numeral of the corresponding gate region. For example, the top layer 320 comprises top semiconductor devices 322-325 which are NMOS transistors, and the bottom layer 330 comprises bottom semiconductor devices 332-335 which are PMOS transistors. In one or more embodiments, the top semiconductor devices include PMOS transistors, and the bottom semiconductor devices include NMOS transistors. The layout diagram 300A comprises a plurality of CFET devices each comprising a top semiconductor device over a corresponding bottom semiconductor device. For simplicity, a CFET device is referred herein by the same reference numeral of the gate region of the top semiconductor device. For example, the CFET device comprising the top semiconductor device 322 stacked over the bottom semiconductor device 332 is referred to as CFET device 322.

The layout diagram 300A further comprises a cut-gate region 340 (e.g., a mask) corresponding to where a gate region is disconnected. Cut-gate regions are sometimes schematically illustrated in the drawings with the label "CPO" (cut-PO). A CPO region is common to both the upper layer 320 and the bottom layer 330. In the example configuration in FIG. 3A, the CPO region 340 extends along the X axis and transversely to the gate regions 323-325 at the upper layer 320 and to the gate regions 333-335 at the bottom layer 330. The gate regions 323-325, 333-335 do not extend along the Y axis into the CPO region 340, and are shorter along the Y axis than the gate regions 322, 332. The shape of the CPO region 340 in FIG. 3A is an example. Other CPO region shapes are within the scopes of various embodiments. In an IC device in accordance with some embodiments, a CPO region corresponds to a dielectric material.

In some embodiments, the layout diagram 300A further comprises source/drain contacts in electrical contact with the corresponding source/drains in the active regions OD-1, OD-2. Source/drain contacts are sometimes referred to as metal-to-device (MD) contacts. Source/drain contacts of top semiconductor devices at the upper layer are sometimes referred to as MD contacts (not shown). Source/drain contacts of bottom semiconductor devices at the lower layer are sometimes referred to as BMD contacts. For simplicity, an MD contact herein refers to either an MD contact at the upper layer or a BMD contact at the lower layer, unless specified otherwise. An MD contact includes a conductive material over a corresponding source/drain in the corresponding active region to define an electrical connection from one or more devices formed in the active region to other internal circuitry of the IC device or to outside circuitry. MD contacts are arranged alternatingly with the gate regions along the X axis. A pitch, i.e., a center-to-center distance along the X axis, between directly adjacent MD contacts is the same as the pitch CPP between directly adjacent gate regions. Example MD and BMD contacts are described with respect to one or more of FIGS. 4A-4B, 5A-5B, 6A-6C.

In some embodiments, the layout diagram 300A further comprises a source/drain local interconnect (MDLI). An MDLI interconnect is a conductive structure physically arranged between, and electrically coupling, source/drains of a top semiconductor device and the corresponding, underlying bottom semiconductor device. Example MDLI interconnects are described with respect to one or more of FIGS. 4A-4B, 5A-5B, 6A-6C.

In some embodiments, the layout diagram 300A further comprises vias on the corresponding gate regions and/or MD contacts. At the front side or upper layer 320, a via on a gate region is sometimes referred to as via-to-gate (VG) via, and a via on an MD contact is sometimes referred to as via-to-device (VD) via. At the back side or bottom layer 330, a via on a gate region is sometimes referred to as a BVG via, and a via on a BMD contact is sometimes referred to as a BVD via. In a manufactured IC device corresponding to the layout diagram 300A, VD, BVD, VG, BVG vias include a conductive material, e.g., a metal. Other vias configurations are within the scopes of various embodiments. Example VD, BVD, VG vias are described with respect to one or more of FIGS. 4A-4B, 5A-5B, 6A-6C.

The VD vias and VG vias are configured to form electrical connections from the corresponding MD contacts and gate regions to conductive patterns in an overlying metal layer, i.e., the M0 layer. Conductive patterns in the M0 layer are indicated herein by a label "M0." The layout diagram 300A comprises, at the upper layer 320 and in the M0 layer, conductive patterns M01, M02, M03. The conductive pattern M01 is configured as a VSS power rail, and extends along the X axis beyond the boundary 310. In some embodiments, the conductive pattern M01 corresponds to one or more of the VSS power rails 212, 214, 216. The conductive patterns M02, M03 are configured for signals. In at least one embodiment, the conductive patterns M02, M03 do not extend beyond, and are confined within, the boundary 310. The conductive patterns M01, M02, M03 are correspondingly arranged along M0 tracks 327-329. Centerlines of the conductive patterns M01, M02, M03 coincide with the corresponding M0 tracks 327-329. Along the Y axis, the M0 track 327 is immediately adjacent to the M0 track 328, which is immediately adjacent to the M0 track 329. Two M0 tracks are considered directly adjacent (or immediately adjacent) where there are no other M0 tracks therebetween. M0 conductive patterns on immediately adjacent M0 tracks are considered immediately adjacent. For example, along the Y axis, the conductive pattern M01 is immediately adjacent to the conductive pattern M02 which is immediately adjacent to the conductive pattern M03. The conductive pattern M02 overlaps the gate regions 321-326, 331-336 in the thickness direction. The conductive pattern M03 overlaps the gate regions 321-326, 331-336 and the active regions OD-1, OD-2 in the thickness direction.

The BVD vias and BVG vias are configured to form electrical connections from the corresponding BMD contacts and gate regions to conductive patterns in a underlying metal layer, i.e., the BM0 layer. Conductive patterns in the BM0 layer are indicated herein by a label "BM0." The layout diagram 300A comprises, at the bottom layer 330 and in the BM0 layer, conductive patterns BM01, BM02, BM03. The conductive pattern BM03 is configured as a VDD power rail, and extends along the X axis beyond the boundary 310. In some embodiments, the conductive pattern BM03 corresponds to one or more of the VDD power rails 224, 226. In at least one embodiment, the conductive pattern BM01 corresponds to one or more of the BM0 conductive patterns 221, 223. In some embodiments, the conductive pattern BM01 corresponds to a VSS power rail in the BM0 layer, and extends along the X axis beyond the boundary 310. In at least one embodiment, the conductive patterns BM01, BM02 do not extend beyond, and are confined within, the boundary 310. The conductive patterns BM01, BM02, BM03 are correspondingly arranged along BM0 tracks 337-339. Centerlines of the conductive patterns BM01, BM02, BM03 coincide with the corresponding BM0 tracks 337-339. Along the Y axis, the BM0 track 337 is immediately adjacent to the BM0 track 338, which is immediately adjacent to the BM0 track 339. Two BM0 tracks are considered directly adjacent (or immediately adjacent) where there are no other BM0 tracks therebetween. BM0 conductive patterns on immediately adjacent BM0 tracks are considered immediately adjacent. For example, along the Y axis, the conductive pattern BM01 is immediately adjacent to the conductive pattern BM02 which is immediately adjacent to the conductive pattern BM03. The conductive pattern BM02 overlaps the gate regions 321-326, 331-336 in the thickness direction. The VDD power rail BM03 overlaps the gate regions 321-326, 331-336 and the active regions OD-1, OD-2 in the thickness direction.

In some embodiments, the layout diagram 300A corresponds to a functional circuit. For example, the CFET devices in the layout diagram 300A are electrically coupled into a functional circuit by one or more MD contacts, MDLI interconnects, VD, BVD, VG, BVG vias, M0 conductive patterns, BM0 conductive patterns, and/or further metal layers and/or via layers on the front side and/or the back side. CFET devices electrically coupled into a functional circuit are sometimes referred to as functional CFET devices. The layout diagram 300A further comprises an embedded power tap cell corresponding to a power tap structure.

The power tap structure in the layout diagram 300A comprises a VDR (VD rail) via 341, a local interconnect (herein referred to as VLI interconnect) 342, a BMD contact 343, and a BVD via 344. The VDR via 341 is under and in electrical contact with the conductive pattern or VSS power rail M01. The VLI interconnect 342 is under and in electrical contact with the VDR via 341. The BMD contact 343 is under and in electrical contact with the VLI interconnect 342. The BVD via 344 is under and in electrical contact with the BMD contact 343. The BVD via 344 is further over and in electrical contact with the conductive pattern BM01. As a result, the VSS power rail M01 is electrically coupled in the thickness direction to the conductive pattern BM01 to receive VSS therefrom.

The VDR via 341 is a VD via and, in some embodiments, is manufactured together with other VD vias. The VSS power rail M01 overlaps, in the thickness direction, at least partially the VDR via 341. In the example configuration in FIG. 3A, the VDR via 341 is larger than other VD vias for signals, the VDR via 341 is elongated along the X axis in the same direction as the VSS power rail M01, and the VSS power rail M01 overlaps, in the thickness direction, an entirety of the VDR via 341.

The VLI interconnect 342 extends from the top semiconductor devices to the bottom semiconductor devices, and is included in both the upper layer 320 and the bottom layer 330 of the layout diagram 300A. The VLI interconnect 342 is confined within the CPO region 340. In a manufactured IC device, the dielectric material corresponding to the CPO region 340 surrounds the VLI interconnect 342 on all sides as seen in a plan view, and electrically isolates the VLI interconnect 342 from other conductive or circuit features. The VLI interconnect 342 overlaps at least partially the VDR via 341 and the BMD contact 343. In the example configuration in FIG. 3A, the VLI interconnect 342 is elongated along the X axis in the same direction as the VSS power rail M01 and the VDR via 341, and has a length of about 2 CPPs along the X axis. In at least one embodiment, a length of the VLI interconnect 342 along the X axis is at least one CPP.

In the example configuration in FIG. 3A, the BMD contact 343 is not formed on or in electrical contact with an active region. In some embodiments, the BMD contact 343 is manufactured together with other BMD contacts which are in electrical contact with an active region in the bottom layer 330. In some embodiments, the BMD contact 343 is in electrical contact with the active region in the bottom layer 330. In the example configuration in FIG. 3A, the BMD contact 343 and the conductive pattern BM01 overlap, in the thickness direction, an entirety of the BVD via 344.

All features of a power tap structure, i.e., the VDR via 341, VLI interconnect 342, BMD contact 343, BVD via 344, are confined within the boundary 310 of the layout diagram 300A. As such, the layout diagram 300A is an example of a functional cell having embedded therein a power tap cell. By embedding power tap cells in functional cells, it is possible in one or more embodiments to reduce the number of independent power tap cells, i.e., power tap cells outside functional cells and/or configured for power delivery only and/or without other functions. As a result, it is possible in one or more embodiments to advantageously reduce the power tap area of manufactured IC devices.

In some other approaches where CFET devices are not used, if a power tap cell was to be incorporated or embedded in a functional cell, a gate connection between an NMOS and a PMOS of the functional cell would be disconnected or separated. In contrast, in one or more embodiments with CFET devices, because the gate connection between an NMOS and a PMOS of a CFET device is in the vertical or thickness direction, it is possible to incorporate or embed a power tap cell in a functional cell without separating the gate connection of the NMOS and PMOS.

In some other approaches, an independent power tap cell comprises a feed through via that electrically couples an M0 jog of a two-dimensional (2D) M0 conductive pattern with a BM0 jog of a 2D BM0 conductive pattern. The M0 jog and/or BM0 jog render(s) one or more M0 and/or BM0 conductive patterns adjacent to the 2D M0 and/or 2D BM0 conductive patterns unavailable for other signals, e.g., for connections inside a cell or for cell interconnects. In contrast, in one or more embodiments, by incorporating a power tap cell in a functional cell and/or by configuring a power tap cell without an M0 jog and/or a BM0 jog, it is possible to maximize usage of M0 and/or BM0 recourses for signals within or between functional cells.

Figure 3B:
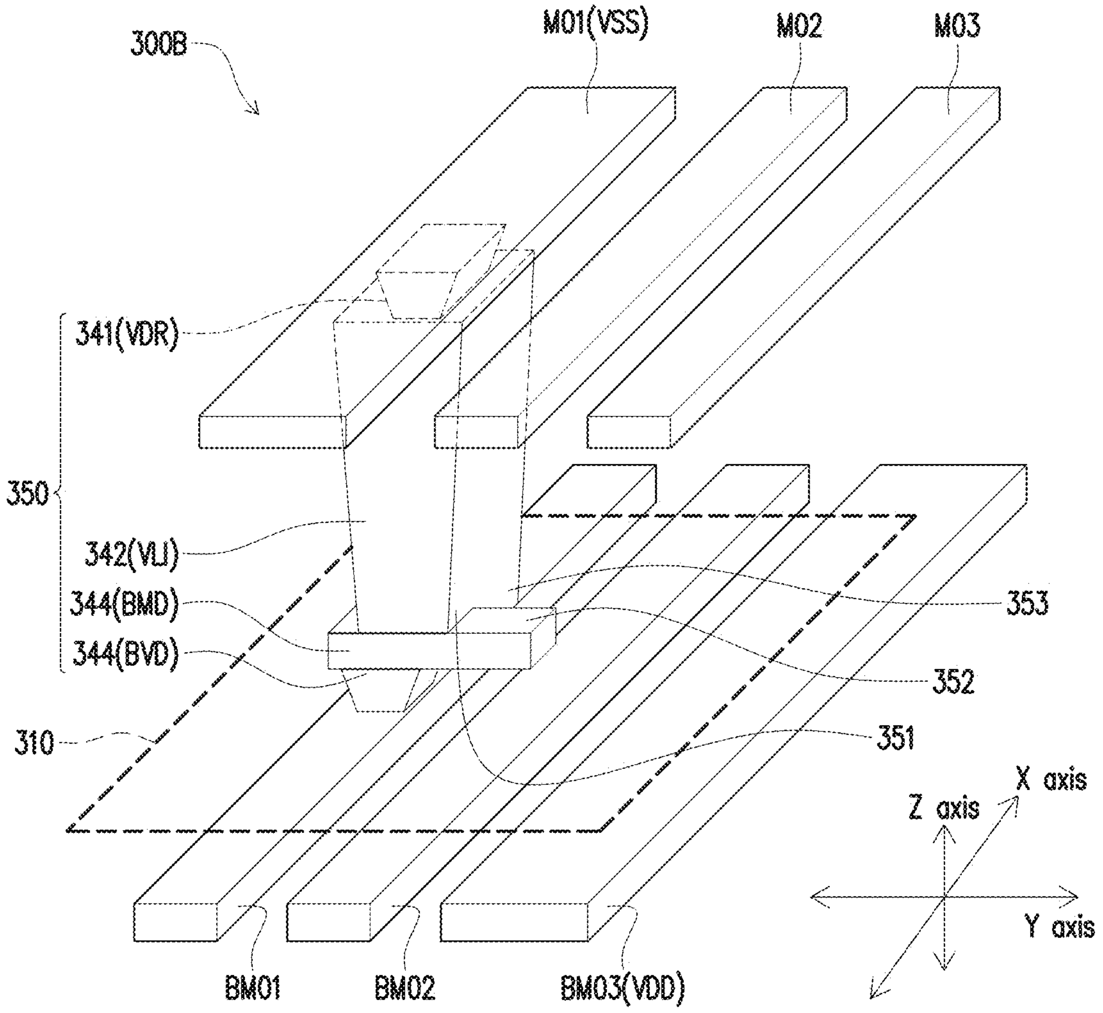
FIG. 3B is a schematic perspective view of a circuit region of an IC device, in accordance with some embodiments.

FIG. 3B is a schematic perspective view of a circuit region of an IC device 300B, in accordance with some embodiments. In some embodiments, the circuit region of the IC device 300B corresponds to the layout diagram 300A. For simplicity, corresponding components in FIGS. 3A, 3B are designated by the same reference numerals.

The IC device 300B comprises a power tap structure 350 electrically coupling the VSS power rail M01 at the front side to the conductive pattern BM01 at the back side. The power tap structure 350 comprises the VDR via 341, VLI interconnect 342, BMD contact 343, BVD via 344. In the example configuration in FIG. 3B, a portion 351 of the VLI interconnect 342 lands on an upper surface 352 of the BMD contact 343. Another portion 353 of the VLI interconnect 342 lands outside the BMD contact 343 and protrudes, in the thickness direction, below the upper surface 352 of the BMD contact 343. This is an example, and other VLI interconnect configurations are within the scopes of various embodiments. In some embodiments, at least a portion of the VLI interconnect 342 is formed together with the BMD contact 343.

In the example configuration in FIG. 3B, the conductive pattern BM01 is a VSS power rail in the BM0 layer. In at least one embodiment where the structure shown in FIG. 3B is repeated along the Y axis, an alternating arrangement of VSS power rails and VDD power rails in the BM0 layer is obtained. In some embodiments, the asymmetrical power placement of VSS power rail M01 and VDD power rail BM03 make it possible to release M0 resource for cell interconnects. In at least one embodiment, one or more advantages described herein are achievable by the IC device 300B.

Figure 4A:
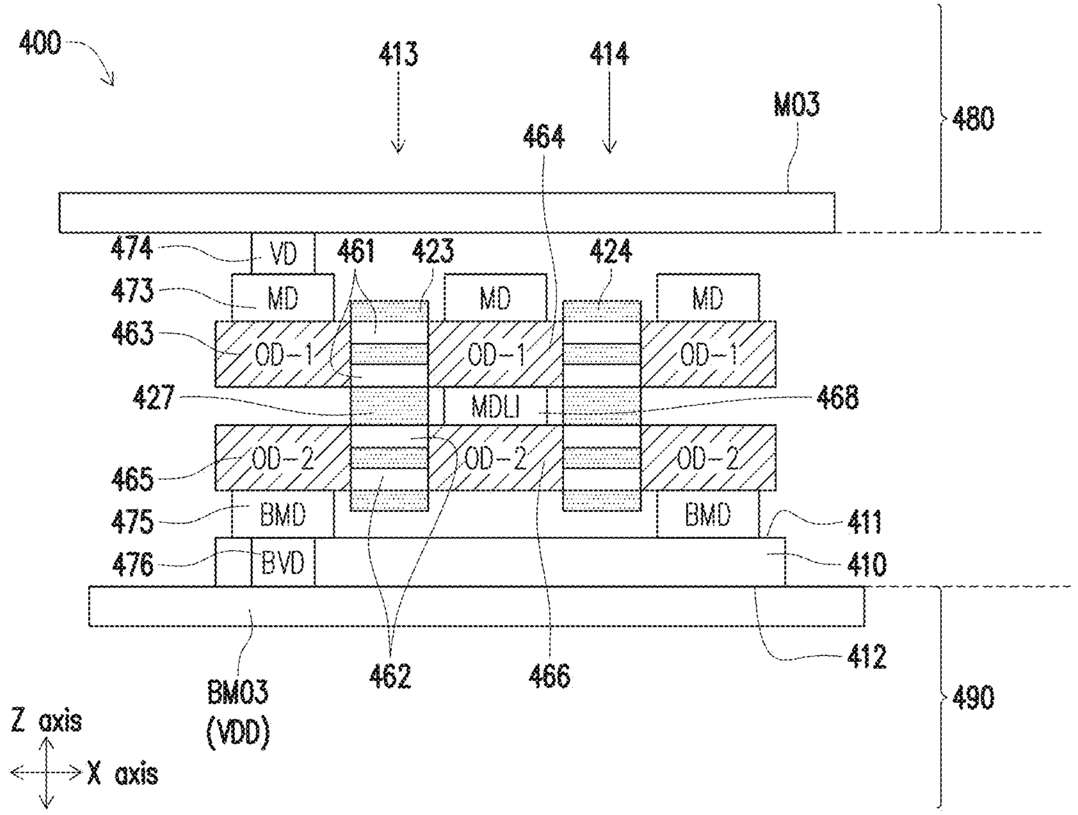
FIGS. 4A-4B are schematic cross-sectional views of a circuit region of an IC device, in accordance with some embodiments.
Figure 4B:
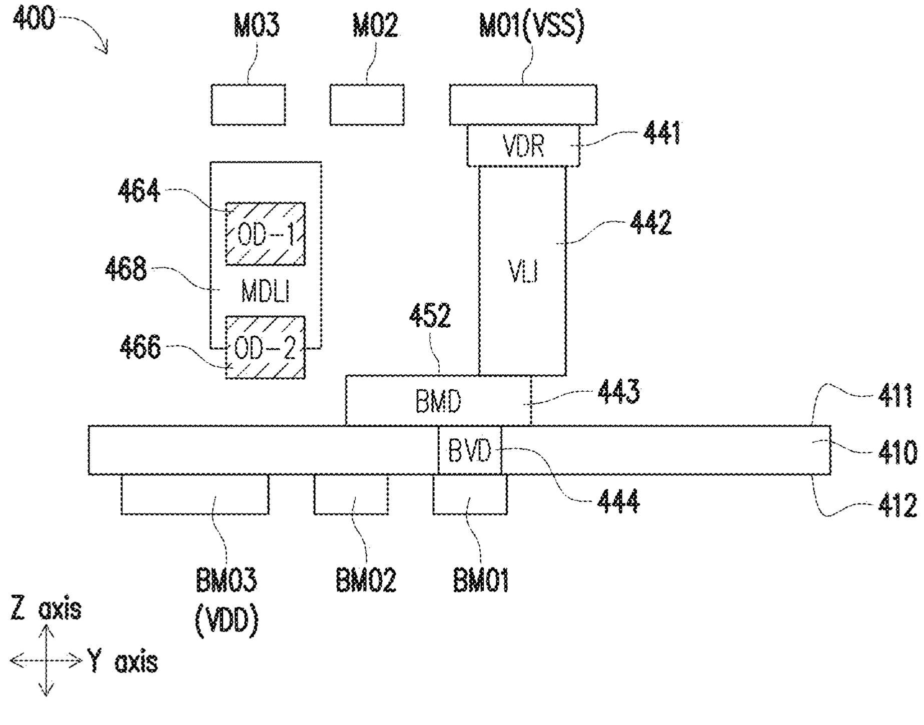

FIGS. 4A-4B are schematic cross-sectional views of a circuit region of an IC device 400, in accordance with some embodiments. In some embodiments, the IC device 400 corresponds to one or more of the IC device 100, IC device 200, layout diagram 300A, IC device 300B. FIG. 4A corresponds to an X axis cross-sectional view taken along line A-A' in FIG. 3A, and FIG. 4B corresponds to a Y axis cross-sectional view taken along line B-B' in FIG. 3A. For simplicity, corresponding components in FIGS. 3A-3B, 4A-4B are designated by the same reference numerals.

As illustrated in FIG. 4A, the IC device 400 comprises a substrate 410 having a front side 411, and a back side 412 opposite to the front side 411 in a thickness direction of the substrate 410. In some embodiments, the substrate 410 comprises a semiconductor material, such as silicon, silicon germanium (SiGe), gallium arsenic, or other suitable semiconductor materials. In some embodiments, the substrate 410 comprises a dielectric material, such as silicon nitride, silicon oxide, ceramic, glass, or other suitable materials. In some embodiments, the substrate 410 comprises a multi-layer structure. In some embodiments, the substrate 410 is omitted, or comprises an insulation layer that replaces an initial semiconductor bulk used during manufacture.

The IC device 400 further comprises CFET devices 413, 414 over the front side 411 of the substrate 410. The CFET device 413 is described in detail herein. The CFET device 414 is configured similarly to the CFET device 413.

In the CFET device 413, a top semiconductor device, e.g., an NMOS, is stacked over a bottom semiconductor device, as a PMOS, as described herein. Each of the top semiconductor device and bottom semiconductor device comprises a channel which is arranged in a corresponding active region. For example, the channel of the NMOS comprises a semiconductor material, such as Si, in the corresponding active region OD-1, and is configured as a plurality of N-type nanosheets 461 stacked over, while being spaced from, each other in the thickness direction. Similarly, the channel of the PMOS comprises a semiconductor material, such as Si, in the corresponding active region OD-2, and is configured as a plurality of P-type nanosheets 462 stacked over, while being spaced from, each other in the thickness direction. The described channel material and nanosheets are examples. Other channel materials and/or channel types, such as nanowire, FinFET, planar, or the like, are within the scopes of various embodiments.

Each of the top semiconductor device and bottom semiconductor device further comprises a gate. For example, the CFET device 413 comprises a gate 423 which corresponds to the gate regions 323, 333 electrically coupled together by a local interconnect 427. In some embodiments, the local interconnect 427 is formed as an integral part of the gate 423 which is an all-around gate extending around the nanosheets 461, 462. In some embodiments, the gate 423 is a metal gate. Other gate materials, such as polysilicon, are within the scopes of various embodiments. In some embodiments, the gate material of the gate 423 replaces a sacrificial material, such as SiGe, in the corresponding active region during a manufacturing process. In at least one embodiment, the CFET device 413 comprises an isolated gate configuration in which the gate of the top semiconductor device is not electrically coupled by a local interconnect to the gate of the underlying bottom semiconductor device, i.e., the local interconnect 427 is omitted in the isolated gate configuration. The CFET device 414 comprises a gate 424 which corresponds to the gate regions 324, 334.

Each top semiconductor device or bottom semiconductor device further comprises a gate dielectric (not shown) between the corresponding gate and channel. For example, a gate dielectric is between the gate 423 and nanosheets 461, 462, and extends around each of the nanosheets 461, 462. Example materials of the gate dielectric include high-k dielectric materials, or the like.

Each top semiconductor device or bottom semiconductor device further comprises source/drains in the corresponding active region. For example, the top semiconductor device of the CFET device 413 includes source/drains 463, 464, and the bottom semiconductor device of the CFET device 413 includes source/drains 465, 466. The source/drain 464 is a common source/drain of the top semiconductor devices of the CFET devices 413, 414. The source/drain 466 is a common source/drain of the bottom semiconductor devices of the CFET devices 413, 414. In some embodiments, a source/drain comprises an epitaxy structure coupled to the adjacent nanosheets. For example, the source/drains 463, 464 are coupled by the nanosheets 461 all in the active region OD-1, and the source/drains 465, 466 are coupled by the nanosheets 462 all in the active region OD-2. In some embodiments, source/drains are grown by epitaxy processes. In the CFET device 413, the top semiconductor device comprises the gate 423, the channel or nanosheets 461, and the source/drains 463, 464. The bottom semiconductor device comprises the gate 423, the channel or nanosheets 462, and the source/drains 465, 466.

The IC device 400 further comprises an MDLI interconnect 468 electrically coupling stacked source/drains 464, 466. In some embodiments, the MDLI interconnect 468 is omitted, and/or another MDLI interconnect is provided between and electrically couples the stacked source/drains 463, 465. An example material of MDLI interconnects comprises a metal.

The IC device 400 further comprises various MD contacts, VD vias, VG vias (not shown) on the front side, and BMD contacts, BVD vias, BVG vias (not shown) on the back side. For example, an MD contact 473 and a VD via 474 together electrically couple the source/drain 463 to the conductive pattern M03 on the front side. A BMD contact 475 and a BVD via 476 together electrically couple the source/drain 465 to the VDD power rail BM03 on the back side. The BMD contact 475 and other BMD contacts of the IC device 400 are formed on the front side 411 of the substrate 410. The BVD via 476 and other BVD vias of the IC device 400 extend through the substrate 410 to come into contact with the corresponding BM0 conductive patterns on the back side 412 of the substrate 410.

The IC device 400 further comprises a front side redistribution structure 480, and a back side redistribution structure 490. The redistribution structure 480 is on the front side, over the VD, VG vias, and comprises a plurality of metal layers and via layers sequentially and alternatingly arranged over the VD, VG vias. The redistribution structure 480 further comprises various interlayer dielectric (ILD) layers (not shown) in which the metal layers and via layers are embedded. The metal layers and via layers of the redistribution structure 480 are configured to electrically couple various elements or circuits of the IC device 400 with each other, and with external circuitry. In the redistribution structure 480, the lowermost metal layer immediately over and in electrical contact with the VD, VG vias is the M0 layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like. The back side redistribution structure 490 is configured similarly to the front side redistribution structure 480 and comprises metal layers BM0, BM1, or the like, and via layers BV0, BV1, or the like. For simplicity, metal layers and via layers in the redistribution structures 480, 490 are not fully illustrated in FIGS. 4A, 4B.

As illustrated in FIG. 4B, the IC device 400 comprises a power tap structure electrically coupling the VSS power rail M01 to the conductive pattern BM01.

The power tap structure comprises a VDR via 441, VLI interconnect 442, BMD contact 443, BVD via 444 corresponding to the VDR via 341, VLI interconnect 342, BMD contact 343, BVD via 344. In the example configuration in FIG. 4B, the VLI interconnect 442 is entirely over an upper surface 452 of the BMD contact 443. In at least one embodiment, a portion of the VLI interconnect 442 extends downward below the upper surface 452, e.g., as described with respect to FIG. 3B. In at least one embodiment, one or more advantages described herein are achievable by the IC device 400.

Figure 5A:
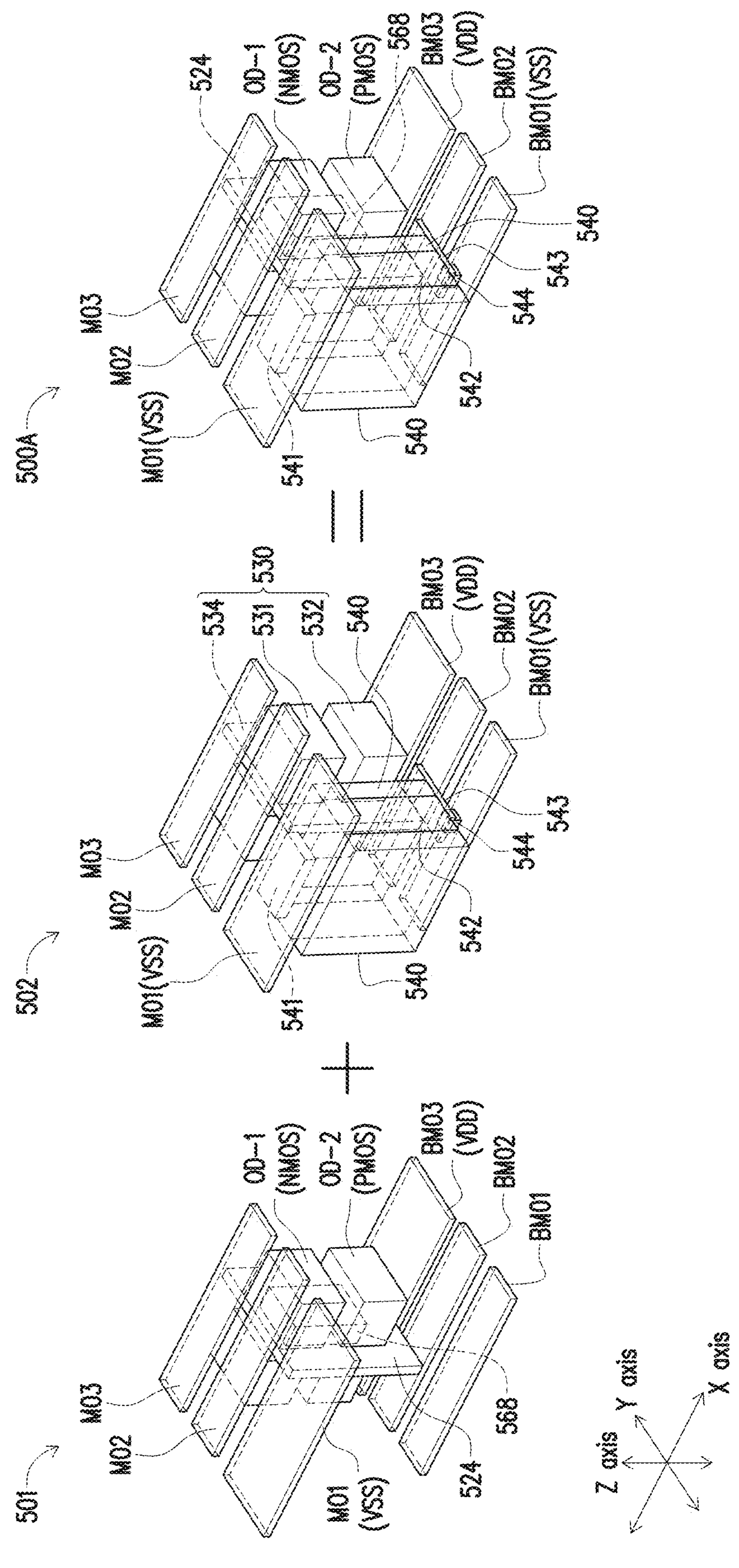
FIGS. 5A-5B include schematic perspective views of various circuit regions of one or more IC devices, in accordance with some embodiments.

FIG. 5A includes schematic perspective views of a circuit region of an IC device 500A, in accordance with some embodiments. In some embodiments, the IC device 500A corresponds to one or more of the IC device 100, IC device 200, layout diagram 300A, IC device 300B, IC device 400. For simplicity, corresponding components in FIGS. 3A-3B, 4A-4B, 5A-5B are designated by the same reference numerals.

The circuit region of the IC device 500A in FIG. 5A is a combination of a CFET device 501, and a power tap structure 502. The CFET device 501 comprises an NMOS corresponding to an active region OD-1, over a PMOS corresponding to an active region OD-2. A gate 524 is common to both the NMOS and PMOS. The gate 524 corresponds to one or more gate regions 321-326, 331-336 and/or gates 423, 424. For example, the gate 524 is an all-around gate corresponding to the gate 424. In some embodiments, the gate 524 has an isolated gate configuration, as described herein. The CFET device 501 further comprises a local interconnect 568 that electrically couples a feature of the NMOS to a feature of the PMOS, in the thickness direction. For example, the local interconnect 568 corresponds to the MDLI interconnect 468. In some embodiments, the local interconnect 568 is omitted. One or more of the gates and source/drains of the CFET device 501 are electrically coupled to other CFET devices in a functional circuit by one or more of the conductive patterns M02, M03, BM02, and/or to one or more of the VSS power rail M01, VDD power rail BM03.

The power tap structure 502 electrically couples the VSS power rail M01 to the conductive pattern BM01, and comprises a VDR via 541, VLI interconnect 542, BMD contact 543, BVD via 544 corresponding to the VDR via 341 or 441, VLI interconnect 342 or 442, BMD contact 343 or 443, BVD via 344 or 444. The VLI interconnect 542 is surrounded by a dielectric material 540 corresponding to a CPO region similar to the CPO region 340. For simplicity, portions of the dielectric material 540 covering the opposite ends of the VLI interconnect 542 along the X axis are not illustrated. Example materials of the dielectric material 540 include, but are not limited to, nitride, oxide, carbide, or the like.

The power tap structure 502 is formed adjacent to a dummy CFET device 530. The dummy CFET device 530 has several possible configurations. In at least one embodiment, the dummy CFET device 530 is configured similar to the CFET device 501, with the exception that the gates and source/drains of the dummy CFET device 530 are not electrically coupled to the other CFET devices, the VSS power rail M01, and the VDD power rail BM03. In some embodiments, a source/drain 531 or a source/drain 532 of the dummy CFET device 530 is a dummy source/drain that contains no epitaxy structures. In at least one embodiment, a gate 534 of the dummy CFET device 530 is a dummy gate that contains a dielectric material. Other dummy CFET configurations are within the scopes of various embodiments.

In some embodiments, the power tap structure 502 formed adjacent to the dummy CFET device 530 is usable to form a power tap between the back side and the front side of an IC device, as described herein, for example, with respect to FIG. 1. In at least one embodiment, the power tap structure 502 formed adjacent to the dummy CFET device 530 is configured as an independent power tap outside functional circuits. In one or more embodiments where a functional circuit includes a dummy CFET device, the power tap structure 502 is formed adjacent to such a dummy CFET device to configure a power tap inside the functional circuit.

A combination of the CFET device 501 and power tap structure 502 results in a circuit region of the IC device 500A, as illustrated at the right side in FIG. 5A. In this combination, the dummy CFET device 530 is replaced with the CFET device 501. The gate 524 of the CFET device 501 is in an Y-Z plane that intersects the VLI interconnect 542. The VLI interconnect 542 is electrically isolated from the gate 524 by the dielectric material 540. In at least one embodiment, one or more advantages described herein are achievable by the IC device 500A.

Figure 5B:
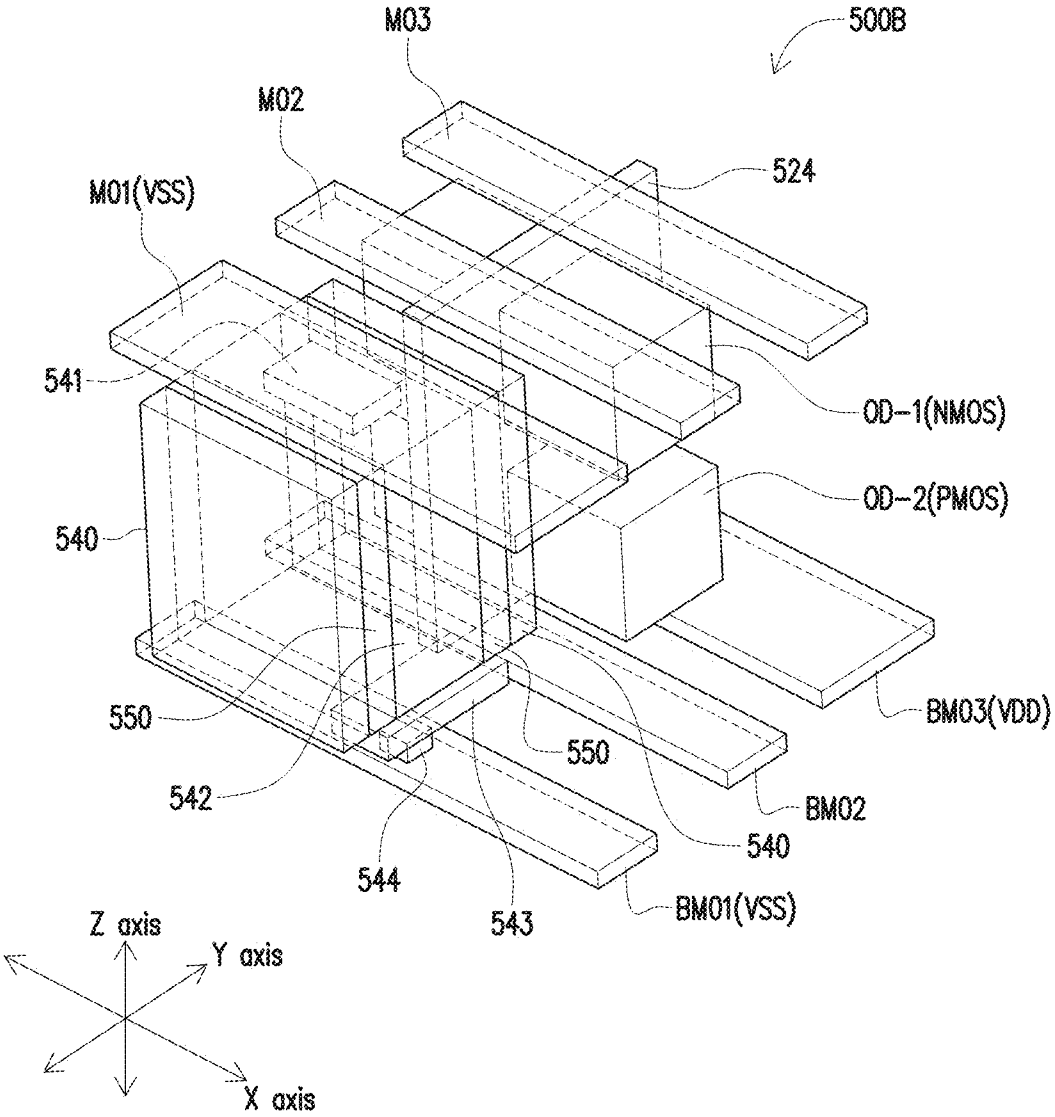

FIG. 5B is a schematic perspective view of a circuit region of an IC device 500B, in accordance with some embodiments. In some embodiments, the IC device 500B corresponds to one or more of the IC device 100, IC device 200, layout diagram 300A, IC device 300B, IC device 400.

The IC device 500B is similar to the IC device 500A, except for a low-k dielectric material 550 between the VLI interconnect 542 and the dielectric material 540. In some embodiments, the low-k dielectric material 550 surrounds the VLI interconnect 542 on all sides as seen in a plan view. In at least one embodiment, a combination of the low-k dielectric material 550 and dielectric material 540 of the IC device 500B corresponds to a CPO region as described herein. The low-k dielectric material 550 has a dielectric constant lower than silicon dioxide. Example materials for the low-k dielectric material 550 include, but are not limited to, fluorine-doped silicon dioxide, organosilicate glass (OSG), carbon-doped oxide (CDO), porous silicon dioxide, or the like. In some embodiments, the low-k dielectric material 550 has a lower dielectric constant than the dielectric material 540. For example, the dielectric material 540 includes silicone dioxide with the dielectric constant higher than the low-k dielectric material 550. In at least one embodiment, the low-k dielectric material 550 reduces the impact of parasitic capacitance associated with the VLI interconnect 542. In at least one embodiment, one or more advantages described herein are achievable by the IC device 500B.

Figure 6A:
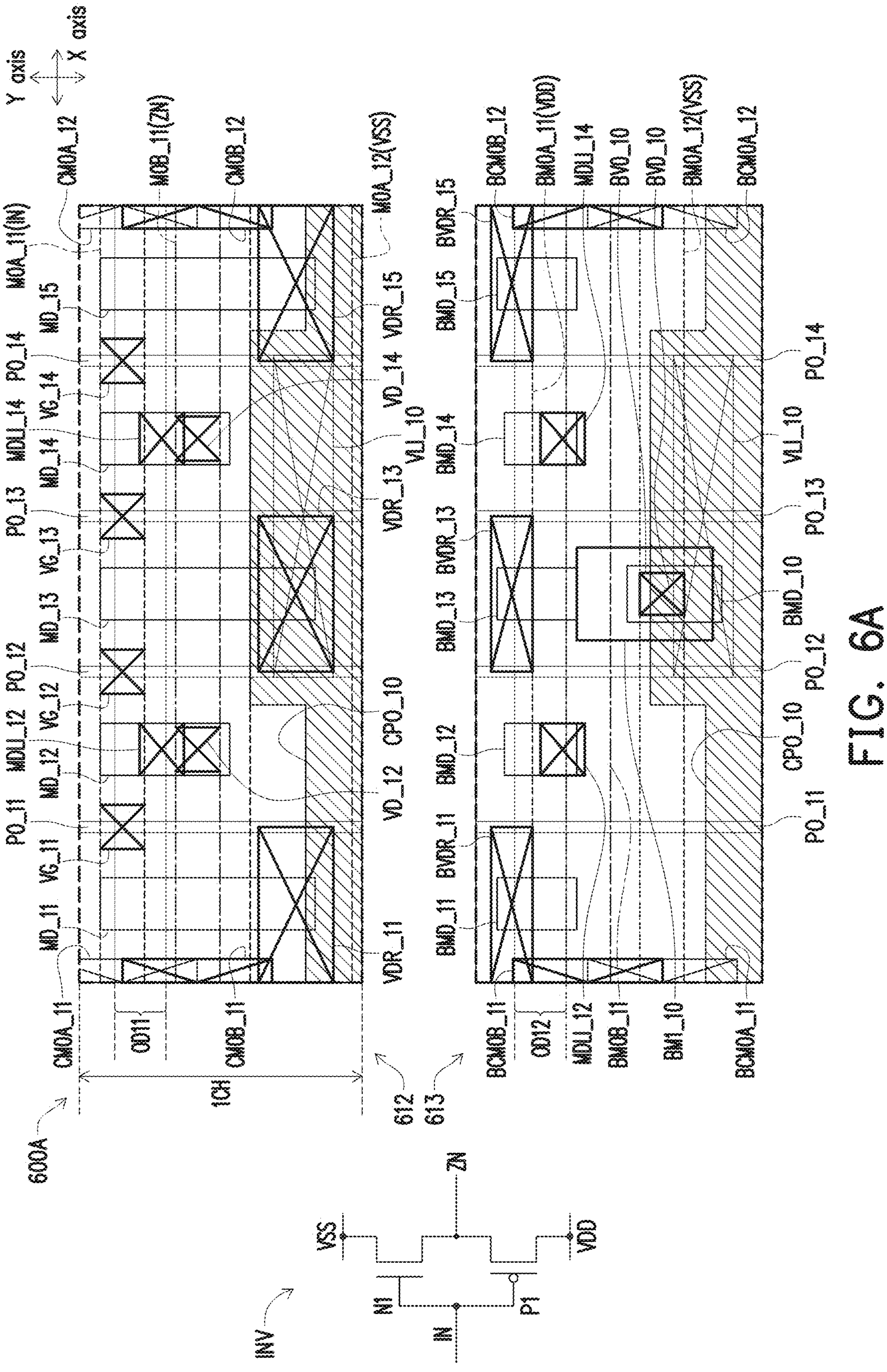
FIG. 6A includes a schematic circuit diagram of a circuit region and schematic views at various layers of a layout diagram of the circuit region, in accordance with some embodiments.

FIG. 6A includes a schematic circuit diagram of a circuit region and schematic views at various layers of a layout diagram 600A of the circuit region, in accordance with some embodiments. In some embodiments, the circuit region in FIG. 6A corresponds to a circuit region of one or more of the IC device 100, IC device 200, IC device 300B, IC device 400, IC device 500A, IC device 500B.

The circuit region in FIG. 6A is an inverter (INV). The inverter INV comprises an NMOS transistor N1 and a PMOS transistor P1 coupled in series between VSS and VDD. Gates of the transistors N1, P1 are coupled to an input IN. A common source/drain of the transistors N1, P1 is coupled to an output ZN. In at least one embodiment, the inverter INV is implemented by one or more CFET devices having the top semiconductor devices corresponding to the transistor N1, and the bottom semiconductor devices corresponding to the transistor P1.

The layout diagram 600A is a layout diagram of a cell INVD4 which corresponds to the inverter INV, and includes four-finger transistors. In a four-finger transistor, four gate regions are electrically coupled together, sources associated with the four gate regions are electrically coupled together, and drains associated with the four gate regions are electrically coupled together. The layout diagram 600A comprises an upper layer 612 and a lower layer 613 corresponding to the upper layer 320 and bottom layer 330. The layout diagram 600A further comprises a boundary (not shown) corresponding to the boundary 310.

The upper layer 612 includes top semiconductor devices, e.g., NMOS transistors, of corresponding CFET devices. The upper layer 612 comprises an NMOS active region OD11, functional gate regions PO_11 to PO_14, MD contacts MD_11 to MD_15, VG vias VG_11 to VG_14, VD vias VD_12, VD_14, VDR vias VDR_11, VDR_13, VDR_15, MDLI interconnects MDLI_12, MDLI_14, M0 conductive patterns M0A_11, M0A_12, M0B_11, cut-M0 (CM0) regions CM0A_11, CM0A_12, CM0B_11, CM0B_12, a CPO region CPO_10, and a local interconnect VLI_10. M0 conductive patterns with the label "M0A" belong to one mask, and M0 conductive patterns with the label "M0B" belong to another mask. A CM0 region with the label "CM0A" is a mask which corresponds to where an otherwise continuous M0A conductive pattern is disconnected, or divided into two separated M0A conductive patterns. A CM0 region with the label "CM0B" is a mask which corresponds to where an otherwise continuous M0B conductive pattern is disconnected, or divided into two separated M0B conductive patterns.

The lower layer 613 includes bottom semiconductor devices, e.g., PMOS transistors, of corresponding CFET devices. The lower layer 613 comprises a PMOS active region OD12, the functional gate regions PO_11 to PO_14, BMD contacts BMD_10 to BMD_15, BVD via BVD_10, BVDR vias BVDR_11, BVDR_13, BVDR_15, the MDLI interconnects MDLI_12, MDLI_14, BM0 conductive patterns BM0A_11, BM0A_12, BM0B_11, cut-BM0 (BCM0) regions BCM0A_11, BCM0A_12, BCM0B_11, BCM0B_12, the CPO region CPO_10, the local interconnect VLI_10, a BV0 via BV0_10, and a BM1 conductive pattern BM1_10. BM0 conductive patterns with the label "BM0A" belong to one mask, and BM0 conductive patterns with the label "BM0B" belong to another mask. A BCM0 region with the label "BCM0A" is a mask which corresponds to where an otherwise continuous BM0A conductive pattern is disconnected, or divided into two separated M0A conductive patterns. A BCM0 region with the label "BCM0B" is a mask which corresponds to where an otherwise continuous BM0B conductive pattern is disconnected, or divided into two separated M0B conductive patterns. The functional gate regions of the PMOS transistors are coupled to the gate regions of the corresponding NMOS transistors and are designated by the same reference numerals PO_11 to PO_14.

The gate regions PO_11 to PO_14 correspond to the four fingers of each of the transistors N1, P1, and are electrically coupled together by conductive pattern M0A_11, which corresponds to the input IN, through corresponding vias VG_11 to VG_14. The sources of the transistor N1 are electrically coupled by contacts MD_11, MD_13, MD_15, and corresponding vias VDR_11, VDR_13 VDR_15 to the conductive pattern M0A_12 which is a VSS power rail. The sources of the transistor P1 are electrically coupled by contacts BMD_11, BMD_13, BMD_15, and corresponding vias BVDR_11, BVDR_13, BVDR_15 to the conductive pattern BM0A_11 which is a VDD power rail. A half of the conductive pattern BM0A_11 is included in the layout diagram 600A at the lower layer 613. The other half of the conductive pattern BM0A_11 is in another cell. The common drains of the transistors N1, P1 are electrically coupled together by the interconnects MDLI_12, MDLI_14 and contacts MD_12, MD_14, BMD_12, BMD_14. The common drains of the transistors N1, P1 are further electrically coupled to the conductive pattern M0B_11, which corresponds to the output ZN, through corresponding vias VD_12, VD_14.

The region CPO_10 and the interconnect VLI_10 therein correspond to the CPO region 340 and VLI interconnect 342. The via VDR_13, interconnect VLI_10, contact BMD_10, via BVD_10 correspond to VDR via 341, VLI interconnect 342, BMD contact 343, BVD via 344, and together configure a power tap structure electrically coupling the VSS power rail M0A_12 to the conductive pattern BM0A_12. The conductive pattern BM0A_12 is electrically coupled through the via BV0_10 and conductive pattern BM1_10 to an underlying power delivery network to receive VSS therefrom, as described with respect to FIG. 1. As a result, VSS is provided from the back side through the power tap structure to the VSS power rail M0A_12 on the front side.

Figure 6B:
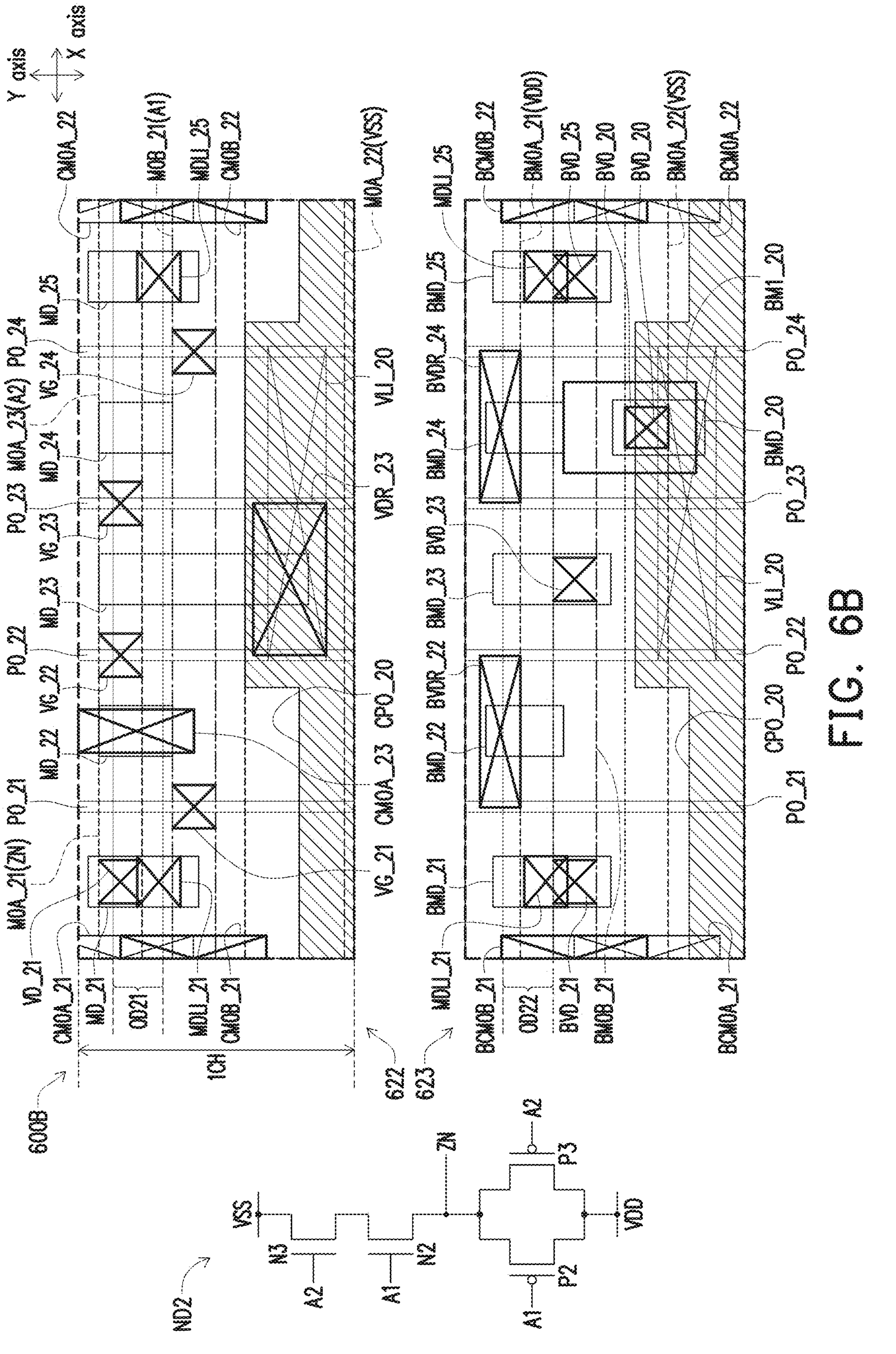
FIG. 6B includes a schematic circuit diagram of a circuit region and schematic views at various layers of a layout diagram of the circuit region, in accordance with some embodiments.

FIG. 6B includes a schematic circuit diagram of a circuit region and schematic views at various layers of a layout diagram 600B of the circuit region, in accordance with some embodiments. In some embodiments, the circuit region in FIG. 6B corresponds to a circuit region of one or more of the IC device 100, IC device 200, IC device 300B, IC device 400, IC device 500A, IC device 500B. Components of the layout diagram 600B having corresponding components in the layout diagram 600A are designated by the same reference numerals increased by ten. For example, active regions OD21, OD22 in the layout diagram 600B correspond to the active regions OD11, OD12 in the layout diagram 600A.

The circuit region in FIG. 6B is a two-input NAND gate (ND2). The ND2 gate comprises NMOS transistors N2, N3, and PMOS transistors P2, P3. The transistors N2, N3 are coupled in series between VSS and an output ZN. The transistors P2, P3 are coupled in parallel between the output ZN and VDD. Gates of transistors N2, P2 are electrically coupled to a first input A1. Gates of transistors N3, P3 are electrically coupled to a second input A2. In at least one embodiment, the ND2 gate is implemented by one or more first CFET devices having the top semiconductor devices corresponding to the transistor N2 and the bottom semiconductor devices corresponding to the transistor P2, and one or more second CFET devices having the top semiconductor devices corresponding to the transistor N3 and the bottom semiconductor devices corresponding to the transistor P3.

The layout diagram 600B is a layout diagram of a cell ND2D2 which corresponds to the ND2 gate, and includes two-finger transistors. The layout diagram 600B comprises an upper layer 622 and a lower layer 623 corresponding to the upper layer 320 and bottom layer 330. The layout diagram 600B further comprises a boundary (not shown) corresponding to the boundary 310.

The upper layer 622 comprises a CM0 region CM0A_23 which separates a M0A conductive pattern into a conductive pattern M0A_21 corresponding to the output ZN, and a conductive pattern M0A_23 corresponding to the input A2. Gate regions PO_21, PO_24 correspond to the two fingers of each of the transistors N2, P2, and are electrically coupled together by conductive pattern M0A_21, which corresponds to the input A1, through corresponding vias VG_21, VG_24. Gate regions PO_22, PO_23 correspond to the two fingers of each of the transistors N3, P3, and are electrically coupled together by conductive pattern M0A_23, which corresponds to the input A2, through corresponding vias VG_22, VG_23. The source of the transistor N3 is electrically coupled by contact MD_23 and via VDR_23 to conductive pattern M0A_22 which is a VSS power rail. The sources of the transistors P2, P3 are electrically coupled by contacts BMD_22, BMD_24, and corresponding vias BVDR_22, BVDR_24 to conductive pattern BM0A_21 which is a VDD power rail. A half of the conductive pattern BM0A_21 is included in the layout diagram 600B at the lower layer 623. The other half of the conductive pattern BM0A_21 is in another cell. The common drains of the transistors P2, P3 and a drain of the transistor N2 are electrically coupled together and to conductive pattern M0A_21, which corresponds to the output ZN, by interconnects MDLI_21, MDLI_25, contacts MD_21, MD_25, BMD_21, BMD_23, BMD_25, vias VD_21, BVD_21, BVD_23, BVD_25, and conductive pattern BM0B_21.

The layout diagram 600B comprises region CPO_20 and interconnect VLI_20 therein which correspond to the CPO region 340 and VLI interconnect 342. Via VDR_23, interconnect VLI_20, contact BMD_20, via BVD_20 correspond to VDR via 341, VLI interconnect 342, BMD contact 343, BVD via 344, and together configure a power tap structure electrically coupling the VSS power rail M0A_22 to conductive pattern BM0A_22. The conductive pattern BM0A_22 is electrically coupled through via BV0_20 and conductive pattern BM1_20 to an underlying power delivery network to receive VSS therefrom, as described with respect to FIG. 1. As a result, VSS is provided from the back side through the power tap structure to the VSS power rail M0A_22 on the front side.

Figure 6C:
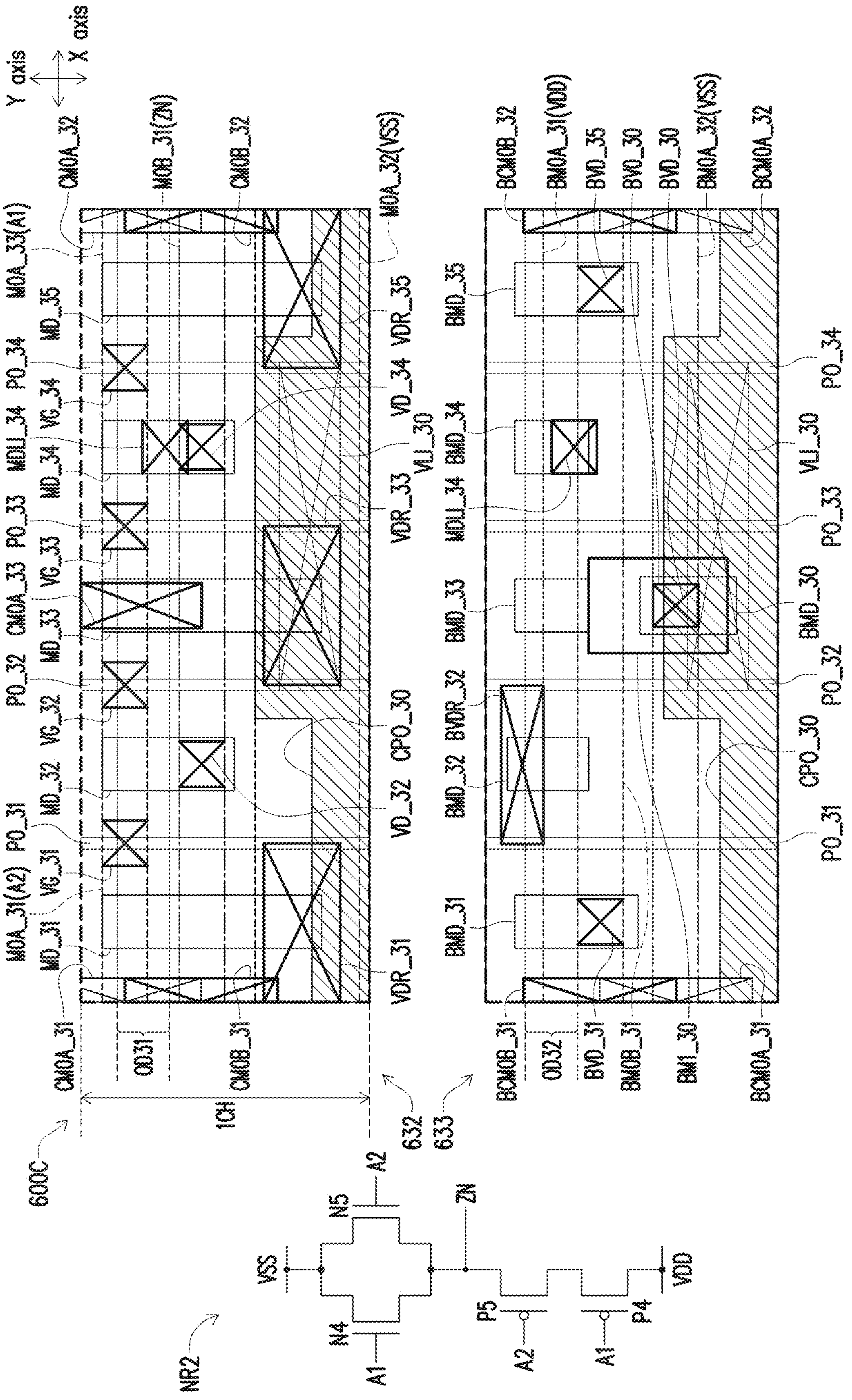
FIG. 6C includes a schematic circuit diagram of a circuit region and schematic views at various layers of a layout diagram of the circuit region, in accordance with some embodiments.

FIG. 6C includes a schematic circuit diagram of a circuit region and schematic views at various layers of a layout diagram 600C of the circuit region, in accordance with some embodiments. In some embodiments, the circuit region in FIG. 6C corresponds to a circuit region of one or more of the IC device 100, IC device 200, IC device 300B, IC device 400, IC device 500A, IC device 500B. Components of the layout diagram 600C having corresponding components in the layout diagram 600A are designated by the same reference numerals increased by twenty. For example, active regions OD31, OD32 in the layout diagram 600C correspond to the active regions OD11, OD12 in the layout diagram 600A.

The circuit region in FIG. 6C is a two-input NOR gate (NR2). The NR2 gate comprises NMOS transistors N4, N5, and PMOS transistors P4, P5. The transistors N4, N5 are coupled in parallel between VSS and an output ZN. The transistors P4, P5 are coupled in series between the output ZN and VDD. Gates of transistors N4, P4 are electrically coupled to a first input A1. Gates of transistors N5, P5 are electrically coupled to a second input A2. In at least one embodiment, the NR2 gate is implemented by one or more first CFET devices having the top semiconductor devices corresponding to the transistor N4 and the bottom semiconductor devices corresponding to the transistor P4, and one or more second CFET devices having the top semiconductor devices corresponding to the transistor N5 and the bottom semiconductor devices corresponding to the transistor P5.

The layout diagram 600C is a layout diagram of a cell NR2D2 which corresponds to the NR2 gate, and includes two-finger transistors. The layout diagram 600C comprises an upper layer 632 and a lower layer 633 corresponding to the upper layer 320 and bottom layer 330. The layout diagram 600C further comprises a boundary (not shown) corresponding to the boundary 310.

The upper layer 632 comprises a CM0 region CM0A_33 which separates a M0A conductive pattern into a conductive pattern M0A_31 corresponding to the input A2, and a conductive pattern M0A_33 corresponding to the input A1. Gate regions PO_31, PO_32 correspond to the two fingers of each of the transistors N5, P5, and are electrically coupled together by conductive pattern M0A_31, which corresponds to the input A2, through corresponding vias VG_31, VG_32. Gate regions PO_33, PO_34 correspond to the two fingers of each of the transistors N4, P4, and are electrically coupled together by conductive pattern M0A_33, which corresponds to the input A1, through corresponding vias VG_33, VG_34. The sources of the transistors N4, N5 are electrically coupled by contacts MD_31, MD_35, and vias VDR_31, VDR_35 to conductive pattern M0A_32 which is a VSS power rail. The source of the transistor P4 is electrically coupled by contact BMD_32 and corresponding via BVDR_32 to conductive pattern BM0A_31 which is a VDD power rail. A half of the conductive pattern BM0A_31 is included in the layout diagram 600C at the lower layer 633. The other half of the conductive pattern BM0A_31 is in another cell. The common drains of the transistors N4, N5 and a drain of the transistor P5 are electrically coupled together and to conductive pattern M0B_31, which corresponds to the output ZN, by interconnect MDLI_34, contacts MD_32, MD_34, BMD_31, BMD_35, vias VD_32, VD_34, BVD_31, BVD_35, conductive pattern BM0B_31.

The layout diagram 600C comprises region CPO_30 and interconnect VLI_30 therein which correspond to the CPO region 340 and VLI interconnect 342. Via VDR_33, interconnect VLI_30, contact BMD_30, via BVD_30 correspond to VDR via 341, VLI interconnect 342, BMD contact 343, BVD via 344, and together configure a power tap structure electrically coupling the VSS power rail M0A_32 to conductive pattern BM0A_32. The conductive pattern BM0A_32 is electrically coupled through via BV0_30 and conductive pattern BM1_30 to an underlying power delivery network to receive VSS therefrom, as described with respect to FIG. 1. As a result, VSS is provided from the back side through the power tap structure to the VSS power rail M0A_32 on the front side.

In at least one embodiment, at least one of the layout diagrams 600A, 600B, 600C is stored as a standard cell in at least one library on a non-transitory computer-readable recording medium, and is read out and placed into a layout diagram of an IC device to be designed and/or manufactured. In at least one embodiment, one or more advantages described herein are achievable by one or more of the layout diagrams 600A, 600B, 600C, and/or IC devices corresponding to one or more of the layout diagrams 600A, 600B, 600C.

The layout diagrams 300A, 600A, 600B, 600C are examples of functional cells each having a cell height of one CH and incorporating therein a power tap cell. Examples of functional cells having a cell height other than one CH, in accordance with some embodiments, are described with respect to FIGS. 7A-7B, 8A-8B.

Figure 7A:
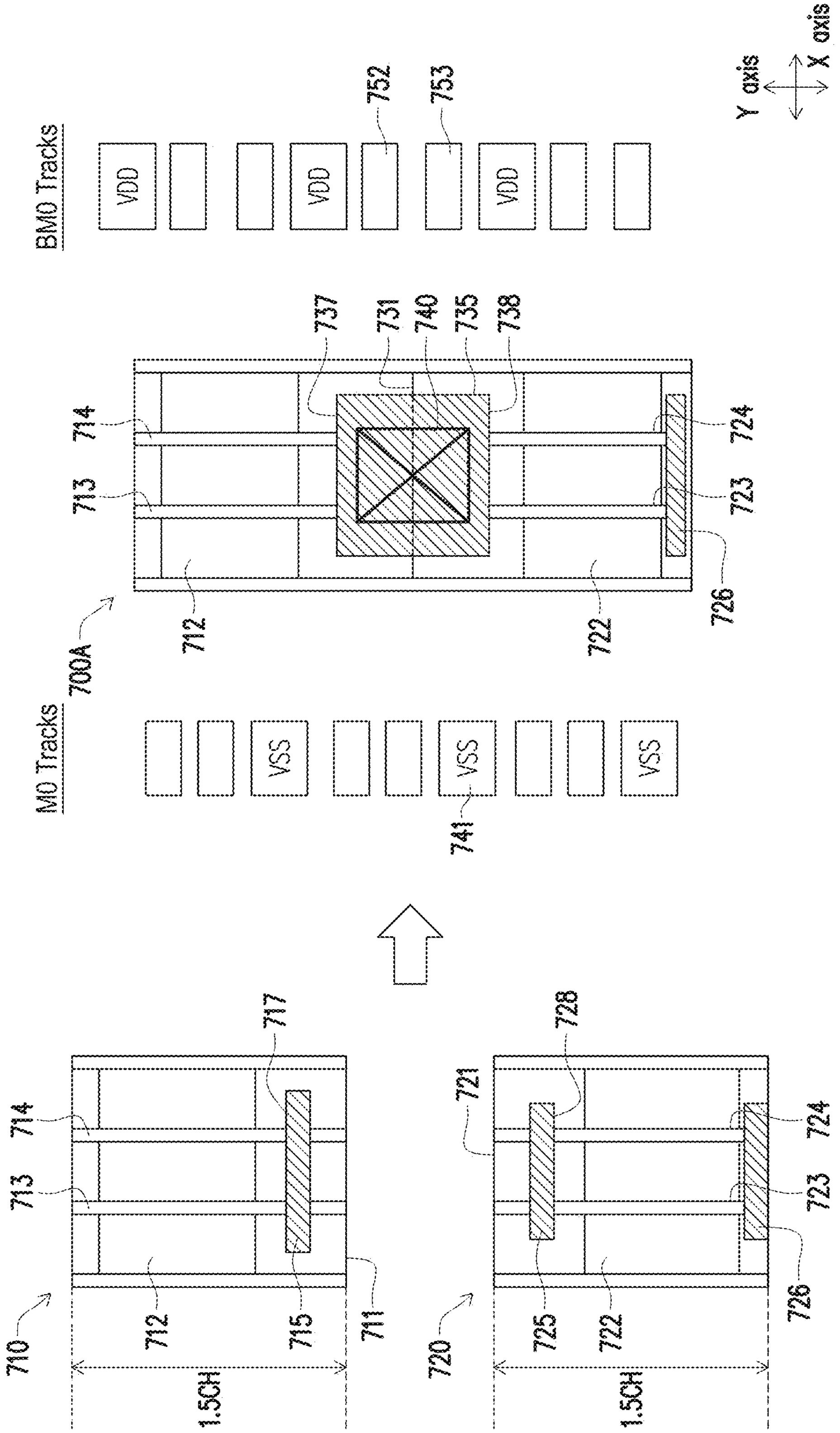
FIG. 7A includes schematic views of cells being placed into a layout diagram of a circuit region of an IC device, in accordance with some embodiments.

FIG. 7A includes schematic views of cells 710, 720 being placed into a layout diagram 700A of a circuit region of an IC device, in accordance with some embodiments. In some embodiments, the circuit region in FIG. 7A corresponds to a circuit region of one or more of the IC device 100, IC device 200, IC device 300B, IC device 400, IC device 500A, IC device 500B. The cells 710, 720 and the layout diagram 700A comprise CFET devices. For simplicity, the upper layers of the CFET devices are illustrated in FIG. 7A, whereas the lower layers are omitted. Further, M0 conductive patterns and BM0 conductive patterns in the layout diagram 700A are not fully illustrated, and are instead schematically shown by corresponding M0 tracks and BM0 tracks correspondingly on the left side and the right side of the layout diagram 700A in FIG. 7A.

Each the cells 710, 720 is a functional cell having a cell height of 1.5 CH. The cell 710 comprises a boundary having an edge 711, an active region 712, gate regions 713, 714, and a CPO region 715 along the edge 711. In at least one embodiment, the boundary of the cell 710, edge 711, active region 712, gate regions 713, 714, and CPO region 715 correspond to the boundary 310, edge 311, active region OD-1, one or more of gate regions 321-326, and CPO region 340. The cell 720 comprises a boundary having an edge 721 to be abutted with the edge 711, an active region 722, gate regions 723, 724, and a CPO region 725 along the edge 721, and a further CPO region 726 along an opposite edge of the boundary of the cell 720. In some embodiments, the CPO region 726 is omitted. In at least one embodiment, the boundary of the cell 720, edge 721, active region 722, gate regions 723, 724, and CPO region 725 correspond to the boundary 310, edge 311, active region OD-1, one or more of gate regions 321-326, and CPO region 340. In some embodiments, the CPO regions 715, 725 do not yet include VLI interconnects for power tap structures.

The cells 710, 720 are placed in the layout diagram 700A, e.g., by an EDA tool or system in an APR operation as described herein, such that the edge 711 abuts the edge 721, resulting in a common edge 731. The gate regions 713, 714 are aligned with the gate regions 723, 724 along the Y axis.

A common CPO region 735 is generated, e.g., by the EDA tool or system, to replace the CPO regions 715, 725. The common CPO region 735 extends continuously along the Y axis across the common edge 731. In some embodiments, the common CPO region 735 comprises an entirety of the CPO region 715 and/or an entirety of the CPO region 725. For example, an edge 737 of the common CPO region 735 coincides with an edge 717 of the CPO region 715, and/or an edge 738 of the common CPO region 735 coincides with an edge 728 of the CPO region 725. In at least one embodiment, it is not necessary that the common CPO region 735 comprises the entirety of the CPO region 715 and/or CPO region 725.

A VLI interconnect 740 is generated, e.g., by the EDA tool or system, within the common CPO region 735. The VLI interconnect 740 extends continuously along the Y axis across the common edge 731. One or more further features, such as a BMD contact, a BVD via and/or a VDR via, are generated, e.g., by the EDA tool or system, to configure together with the VLI interconnect 740 a power tap structure, as described herein. For example, a power tap structure including the VLI interconnect 740 is configured to electrically couple a VSS power rail 741 in the M0 layer to a conductor 752 or 753 in the BM0 layer.

Figure 7B:
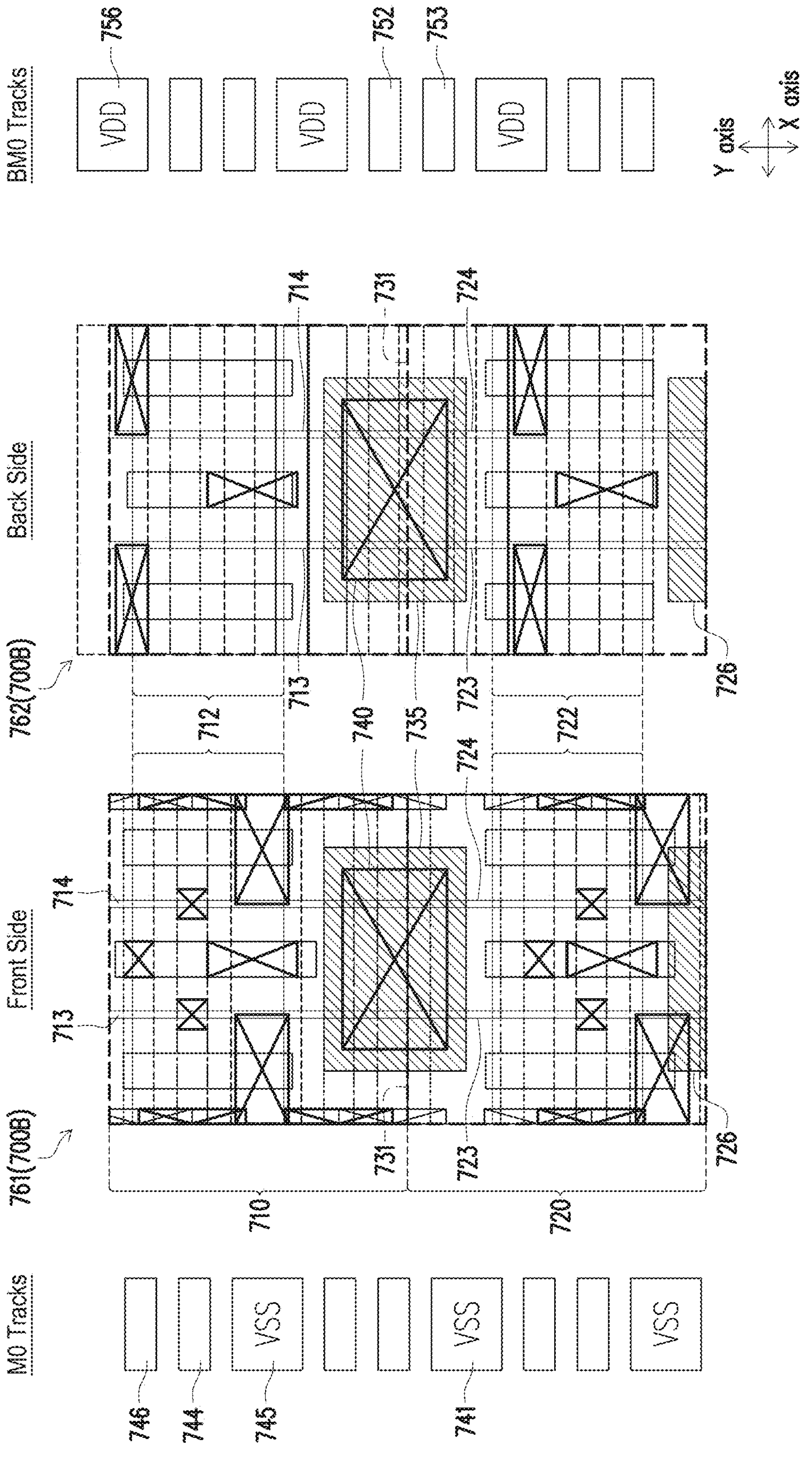
FIG. 7B includes schematic views at various layers of a layout diagram of a circuit region of an IC device, in accordance with some embodiments.

FIG. 7B includes schematic views at various layers of a layout diagram 700B of a circuit region of an IC device, in accordance with some embodiments. In some embodiments, the circuit region in FIG. 7B corresponds to a circuit region of one or more of the IC device 100, IC device 200, IC device 300B, IC device 400, IC device 500A, IC device 500B. For simplicity, corresponding components in FIGS. 7A, 7B are designated by the same reference numerals.

The layout diagram 700B is a specific example of the layout diagram 700A when each of the cells 710, 720 is an INVD2 cell which is an inverter including two-finger transistors.

For the cell 710, at an upper layer 761 of the layout diagram 700B, gate regions 713, 714 of top semiconductor devices, e.g., NMOS transistors, are electrically coupled together, by corresponding VG vias and an M0 conductive pattern 744. The sources of the NMOS transistors are electrically coupled by corresponding MD contacts and VDR vias to a VSS power rail 745 in the M0 layer. At a lower layer 762 of the layout diagram 700B, sources of bottom semiconductor devices, e.g., PMOS transistors, are electrically coupled by corresponding BMD contacts and BVDR vias to a VDD power rail 756 in the BM0 layer. Drains of the NMOS and PMOS transistors are electrically coupled by an MDLI interconnect and a VD via VD to an M0 conductive pattern 746. NMOS and PMOS transistors in the cell 720 are coupled similarly to configure a corresponding inverter.

A power tap structure including the VLI interconnect 740 is configured to electrically couple the VSS power rail 741 in the M0 layer to the conductor 752 or 753 in the BM0 layer, as described herein. The layout diagrams 700A, 700B are examples in which a power tap structure, or a power tap cell, is arranged between functional cells 710, 720 placed in abutment with each other. In at least one embodiment, the functional cells 710, 720 are parts of a functional circuit in which the power tap structure, or a power tap cell, including the VLI interconnect 740 is embedded. In at least one embodiment, one or more advantages described herein are achievable by one or more of the layout diagrams 700A, 700B, and/or IC devices corresponding to one or more of the layout diagrams 700A, 700B.

Figure 8A:
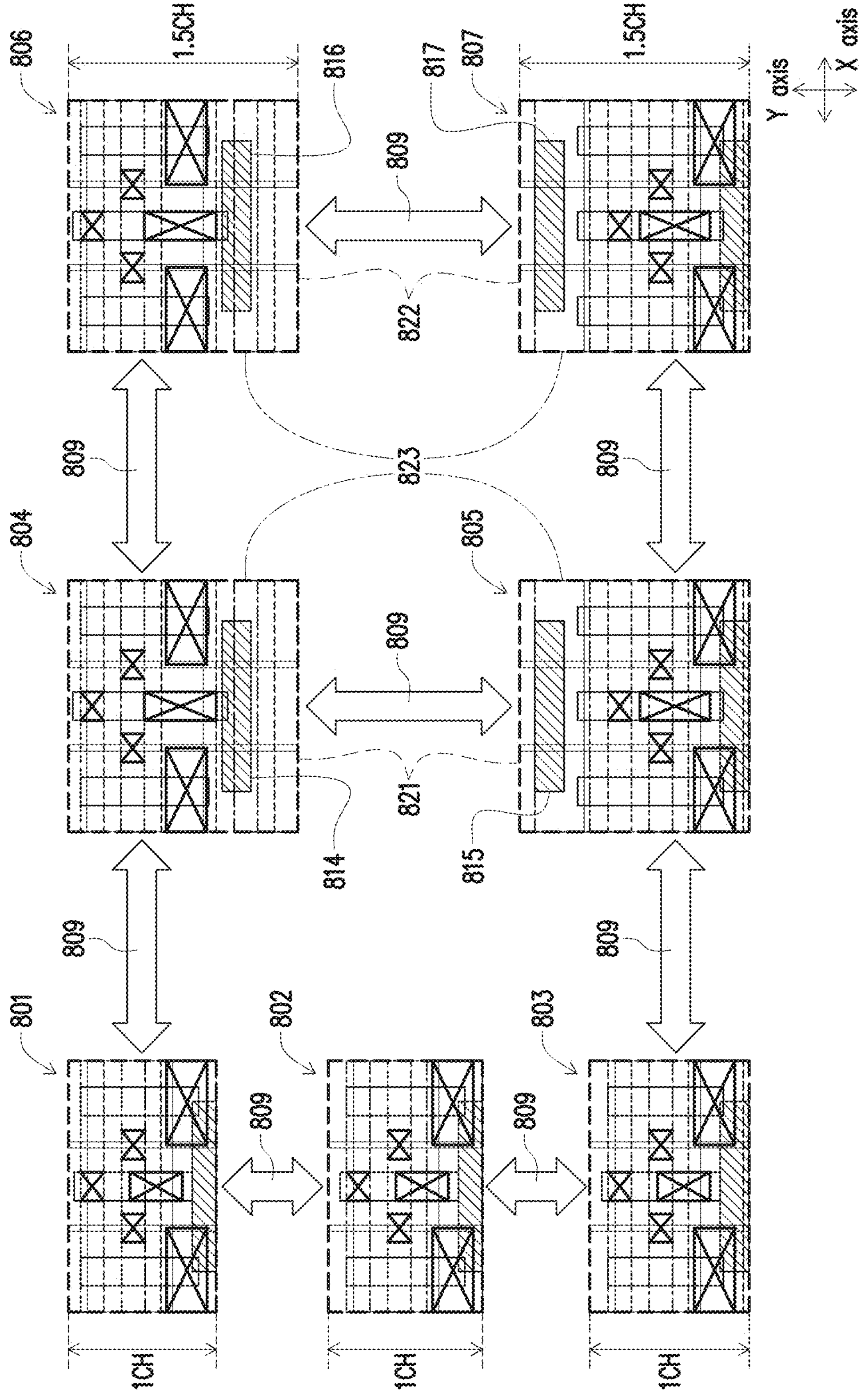
FIG. 8A includes schematic views of cells being placed into a layout diagram of a circuit region of an IC device, and FIG. 8B includes various schematic views of the layout diagram after cell placement, in accordance with some embodiments.
Figure 8B:
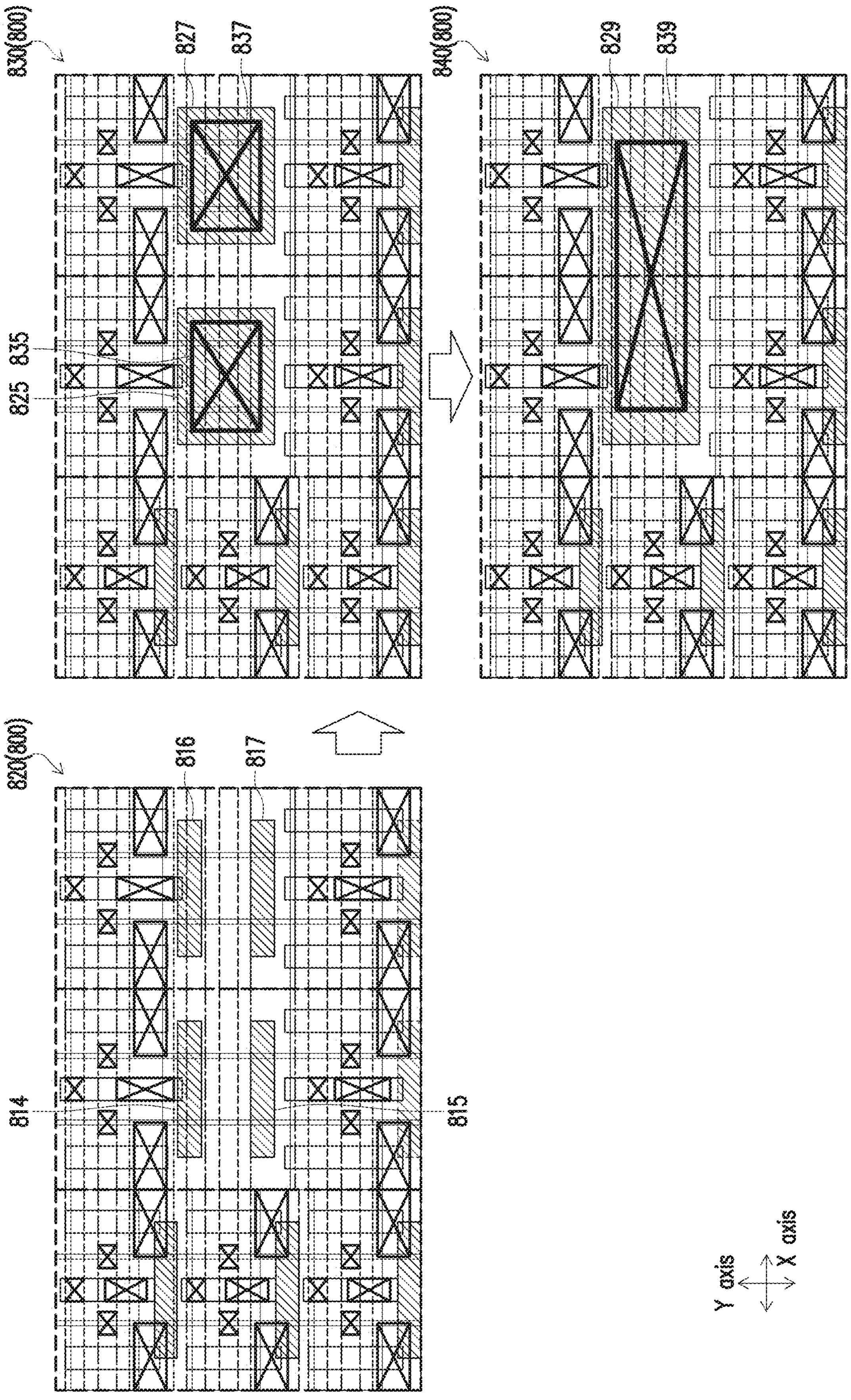

FIG. 8A includes schematic views of cells 801-807 being placed into a layout diagram 800 of a circuit region of an IC device, in accordance with some embodiments. FIG. 8B includes various schematic views of the layout diagram 800 after cell placement, in accordance with some embodiments. In some embodiments, the circuit region in FIGS. 8A-8B corresponds to a circuit region of one or more of the IC device 100, IC device 200, IC device 300B, IC device 400, IC device 500A, IC device 500B. The cells 801-807 and the layout diagram 800 comprise CFET devices. For simplicity, the upper layers of the CFET devices are illustrated in FIGS. 8A-8B, whereas the lower layers are omitted.

In the example configuration in FIG. 8A, each of the cells 801-807 is an INVD2 cell. The cell 801-803 have a cell height of one CH, whereas the cells 804-807 have a cell height of 1.5 CH. In some embodiments, the cells 804, 806 correspond to the cell 710 and have CPO regions 814, 816 corresponding to CPO region 715, whereas the cells 805, 807 correspond to the cell 720 and have CPO regions 815,

817 corresponding to CPO region 725. The cells 801-807 are placed in abutment with each other as schematically indicated by double-end arrows 809. As a result of cell placement, a common edge 821 is obtained between the cells 804, 805, common edge 822 is obtained between the cells 806, 807, and a common edge 823 is obtained among the cells 804-807.

In FIG. 8B, a schematic view 820 shows the layout diagram 800 after the cell placement. The CPO regions 814, 815 are merged into, or replaced with, a common CPO region 825 extending across the common edge 821, and a VLI interconnect 835 is generated inside the common CPO region 825, as described herein with respect to FIG. 7B. Similarly, CPO regions 816, 817 are merged into, or replaced with, a common CPO region 827 extending across the common edge 822, and a VLI interconnect 837 is generated inside the common CPO region 827. A schematic view 830 shows the layout diagram 800 at this stage. In at least one embodiment, one or more further features, such as BMD contacts, BVD vias and/or VDR vias, are generated to configure, together with the VLI interconnects 835, 837, corresponding power tap structures. The power tap structures corresponding to the VLI interconnects 835, 837 are configured to electrically deliver power from one side to the other side of an IC device manufactured in accordance with the layout diagram 800 as shown at the schematic view 830.

In some embodiments, the layout diagram 800 is further modified after generating the CPO regions 825, 827. For example, the CPO regions 825, 827 are merged into, or replaced with, a common CPO region 829 extending across the common edge 823, and a VLI interconnect 839 is generated inside the common CPO region 829. A schematic view 840 shows the layout diagram 800 at this stage. In at least one embodiment, one or more further features, such as BMD contacts, BVD vias and/or VDR vias, are generated to configure, together with the VLI interconnect 839, one or more power tap structures. The one or more power tap structures corresponding to the VLI interconnect 839 are configured to electrically deliver power from one side to the other side of an IC device manufactured in accordance with the layout diagram 800 as shown at the schematic view 840. In at least one embodiment, one or more advantages described herein are achievable by the layout diagram 800, and/or an IC device corresponding to the layout diagram 800.

Figure 9A:
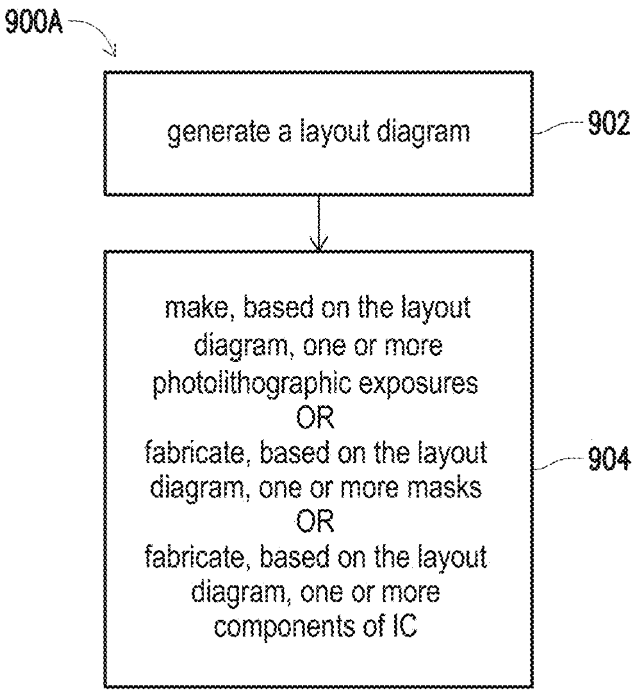
FIGS. 9A-9D are flowcharts of various methods, in accordance with some embodiments.

FIG. 9A is a flowchart of a method 900A of generating a layout and using the layout to manufacture an IC device, in accordance with some embodiments. Method 900A is implementable, for example, using an EDA system and/or an integrated circuit (IC) manufacturing system as described herein, in accordance with some embodiments. Regarding method 900A, examples of the layout include the layout diagrams disclosed herein, or the like. Examples of an IC device to be manufactured according to method 900A include one or more of the IC devices disclosed herein.

At operation 902, a layout is generated which, among other things, include at least one power tap cell or power tap structure embedded in a functional cell or a functional circuit, as described herein.

At operation 904, based on the layout, at least one of (A) one or more photolithographic exposures are made or (B) one or more semiconductor masks are fabricated or (C) one or more components in a layer of an IC device are fabricated.

Figure 9B:
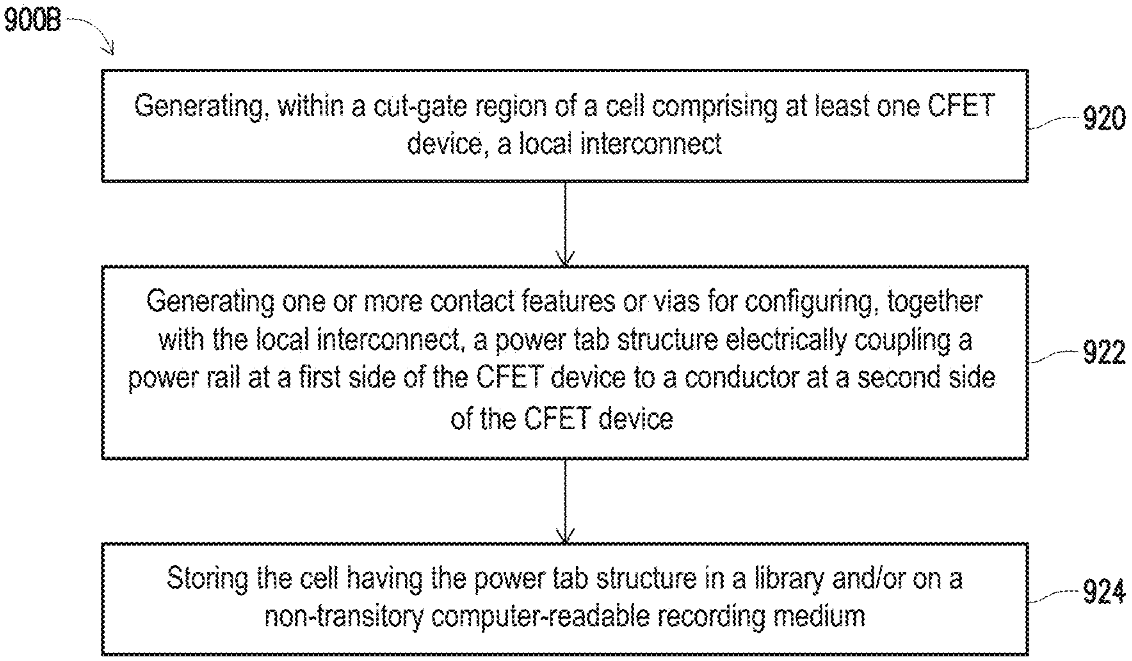

FIG. 9B is a flowchart of a method 900B of generating a layout, in accordance with some embodiments. The flowchart of FIG. 9B shows additional operations that demonstrate one or more examples of procedures implementable in operation 902 of FIG. 9A, in accordance with one or more embodiments.

At operation 920, a local interconnect is generated within a cut-gate region of a cell comprising at least one CFET device. For example, an EDA tool or system as described herein loads from a library a cell as described with respect to FIG. 3A, but without a VLI interconnect 342. The EDA tool or system further generates a VLI interconnect 342 within a CPO region 340 of the cell.

At operation 922, one or more contact features or vias for configuring, together with the local interconnect, a power tab structure are generated for electrically coupling a power rail at a first side of the CFET device to a conductor at a second side of the CFET device. For example, the EDA tool or system as described herein generates one or more of a VDR via 341, BMD contact 343, BVD via 344, if not already included in the cell, for configuring together with the VLI interconnect 342 a power tap structure, as described with respect to FIGS. 3A-3B. The power tap structure electrically couples a VSS power rail M01 at the front side to a conductive pattern BM01 at the back side of a CFET device, as also described with respect to FIGS. 3A-3B.

At operation 924, the cell with the power tap structure configured or embedded therein is stored in a library and/or on a non-transitory computer-readable recording medium. For example, the cell corresponding to the layout diagram 300A is stored as a standard cell for later retrieval and placement in a layout diagram.

Figure 9C:
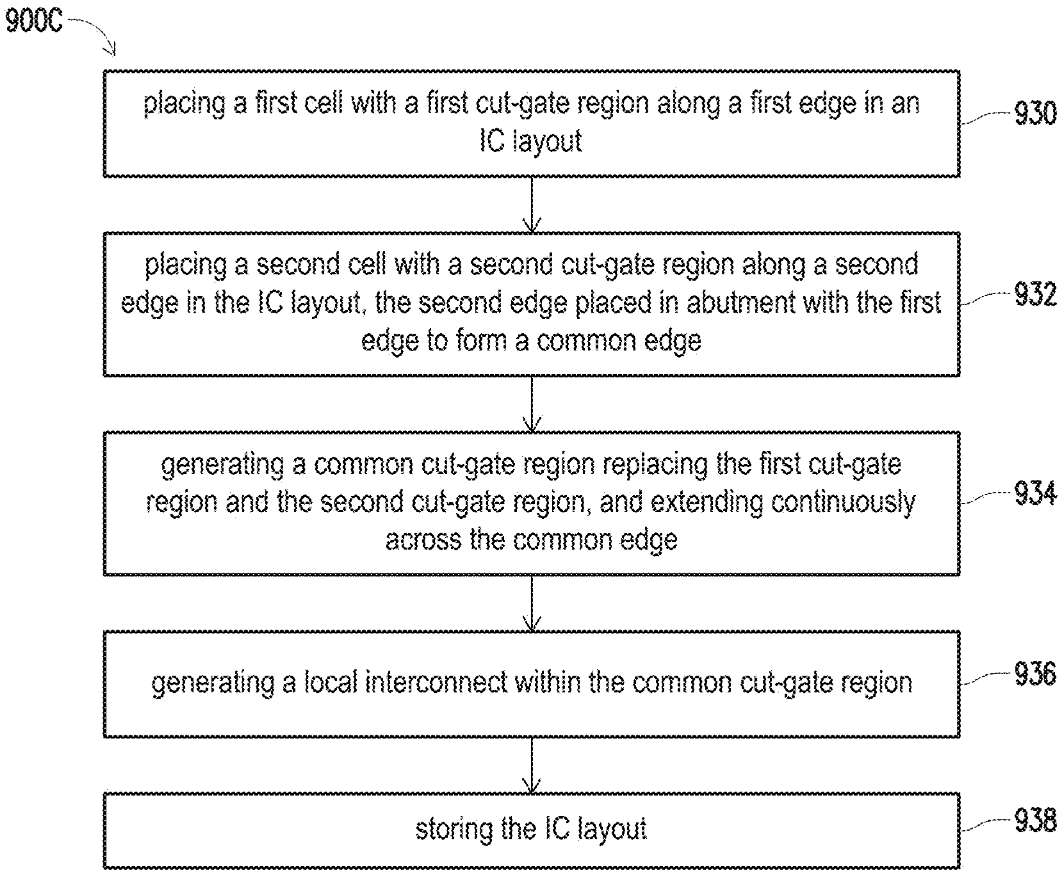

FIG. 9C is a flowchart of a method 900C of generating a layout, in accordance with some embodiments. The flowchart of FIG. 9C shows additional operations that demonstrate one or more further examples of procedures implementable in operation 902 of FIG. 9A, in accordance with one or more embodiments. Compared to the method 900B for generating or embedding a power tap structure in a cell, the method 900C is for generating or embedding a power tap structure between multiple cells.

At operation 930, a first cell with a first cut-gate region along a first edge is placed in an IC layout. For example, an EDA tool or system as described herein places a cell 710 with a CPO region 715 along an edge 711 of the cell 710 in a layout diagram.

At operation 932, a second cell with a second cut-gate region along a second edge is placed in the IC layout, with the second edge abutting the first edge to form a common edge of the first and second cells. For example, as described with respect to FIG. 7A, the EDA tool or system places a cell 720 with a CPO region 725 along an edge 721 of the cell 720 in the layout diagram. The edge 721 abuts the edge 711 to form a common edge 731 of the cells 710, 720.

At operation 934, a common cut-gate region is generated. The common cut-gate region replaces the first cut-gate region and the second cut-gate region, and extends continuously across the common edge. For example, as described with respect to FIG. 7A, the EDA tool or system generates a common CPO region 735 which replaces the CPO regions 715, 725, and extends continuously across the common edge 731.

At operation 936, a local interconnect is generated within the common cut-gate region. For example, as described with respect to FIG. 7A, the EDA tool or system generates a VLI interconnect 740 within the common CPO region 735. In some embodiments, one or more contact features or vias for configuring, together with the VLI interconnect 740, a power tab structure are also generated for electrically coupling a power rail at a first side to a conductor at a second side, as described herein.

At operation 938, a the IC layout is stored in a non-transitory computer-readable recording medium, as described herein.

Figure 9D:
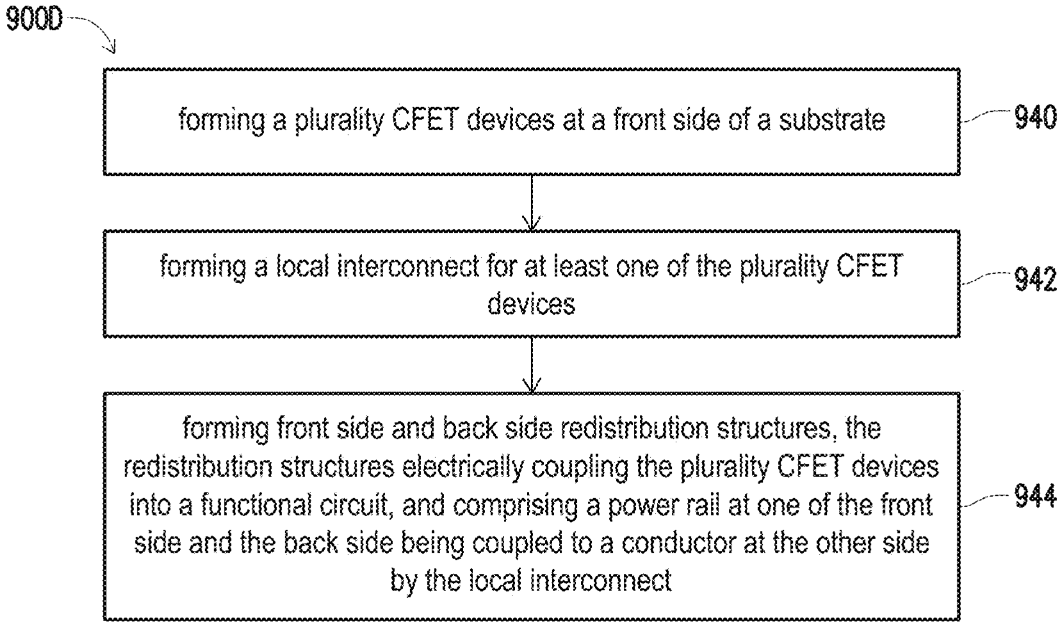

FIG. 9D is a flowchart of a method 900D of manufacturing an IC device, in accordance with some embodiments. The flowchart of FIG. 9D shows additional operations that demonstrate one or more examples of procedures implementable in operation 904 of FIG. 9A, in accordance with one or more embodiments.

At operation 940, a plurality CFET devices is formed at a front side of a substrate. For example, various CFET devices are formed at a front side 411 of a substrate 410, as described with respect to FIGS. 4A-4B.

An example manufacturing process starts from the substrate 410. In some embodiments, the substrate 410 is a silicon-on-insulator (SOI) substrate having a semiconductor bulk, and an insulation layer over the semiconductor bulk. Other substrate configurations are within the scopes of various embodiments.

Alternating layers of a first semiconductor material and a second semiconductor material different from the first semiconductor material are sequentially deposited over the front side 411 of the substrate 410. In some embodiments, the first semiconductor material comprises silicon, and the second semiconductor material comprises SiGe. As a result, alternating SiGe/Si/SiGe/Si layers are stacked over the front side 411 of the substrate 410. In some embodiments, the alternating layers SiGe/Si/SiGe/Si are formed by an epitaxy process. Other materials and/or manufacturing processes for the alternating layers of the different first and second semiconductor materials are within the scopes of various embodiments.

In some embodiments, sacrificial gate structures are formed over the alternating layers SiGe/Si/SiGe/Si, to be used as a mask for subsequent patterning, and for later formation of a metal gate. In an example, each sacrificial gate structure includes various sacrificial layers, such as a sacrificial gate electrode (e.g., polysilicon), a hard mask layer (e.g., SiN, SiCN, SiO, or the like). The sacrificial gate structures are formed by deposition processes, lithography processes, etching processes, combinations thereof, or the like. The alternating layers SiGe/Si/SiGe/Si are patterned by using the sacrificial gate structures as a mask.

Various semiconductor devices are next fabricated. In at least one embodiment, isolation regions are formed in trenches to separate and electrically isolate active regions of the devices to be manufactured. In some embodiments, one or more dielectric materials, such as SiO and/or SiN, are deposited, e.g., by chemical vapor deposition (CVD), plasma enhanced CVD (PECVD), atomic layer deposition (ALD), physical vapor deposition (PVD), thermal oxidation, or the like. Subsequently, the dielectric material is recessed, e.g., by etching and/or chemical mechanical polishing (CMP) to form the isolation regions.

In some embodiments, SiGe at exposed edges of the alternating layers SiGe/Si/SiGe/Si are selectively removed by an etching process. In some embodiments, the selective removal of SiGe include an oxidation process followed by a selective etching.

In some embodiments, source/drains features similar to the source/drains 463-466 are epitaxially grown as epitaxy structures. The source/drain features are grown to be in contact with the exposed edges of the Si layers. Example epitaxy processes include, but are not limited to, CVD deposition, ultra-high vacuum CVD (UHV-CVD), low-pressure CVD (LPCVD), plasma-enhanced CVD (PECVD), selective epitaxial growth (SEG) or the like.

In some embodiments, a metal gate replacement process is performed to replace the sacrificial gate structures with metal gate structures. In some embodiments, the sacrificial gate structures are removed by one or more etching processes, such as wet etching, dry etching, or the like. The SiGe layers are selectively removed by a selective oxidation/etching process. The Si layers remain, and configure nanosheets 461, 462 for top and bottom semiconductor devices. Metal gate structures are formed to wrap around the nanosheets 461, 462. In some embodiments, each metal gate structure includes a gate dielectric wrapping around the nanosheets 461, 462, and a metal gate, e.g., gate 423, 424, over the gate dielectric to obtain corresponding top and bottom semiconductor devices. Example materials of the gate dielectric includes a high-k dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr) TiO3 (BST), Si3N4, hafnium dioxide-alumina (HfO2-Al2O3) alloy, or the like. In some embodiments, the gate dielectric is deposited by CVD, PVD, ALD, or the like. In some embodiments, each metal gate includes one or more metals such as Al, Cu, W, Ti, Ta, TiN, TaN, NiSi, CoSi, and is formed by, e.g., CVD, ALD, PVD, plating, chemical oxidation, thermal oxidation, or the like.

At operation 942, a local interconnect is formed for at least one of the plurality CFET devices. For example, one or more local interconnects, such as VLI and/or MDLI interconnects, as well as various MD contacts, VD vias, VG vias are formed, e.g., by etching and metal depositing operations. In some embodiments, a VLI interconnect, e.g., the VLI interconnect 342, is formed within a region corresponding to a CPO mask, e.g., within the CPO region 340. In one or more embodiments, the CPO region 340 includes a low-k dielectric material surrounding the VLI interconnect 342.

At operation 944, a front side redistribution structure and a back side redistribution structure are formed. For example, deposition and patterning operations are performed to form a front side redistribution structure 480 at the front side 411 of the substrate 410. Thereafter, the IC device being manufactured is flipped upside down and temporarily bonded to a carrier. Wafer thinning is performed from the back side 412 (now facing upward) to remove a portion of the substrate 410. In some embodiments, the wafer thinning process includes a grinding operation, a polishing operation (such as, chemical mechanical polishing (CMP)), or the like. In at least one embodiment, an original substrate for forming the CFET devices is completely removed, and a new substrate, e.g., an insulation substrate, is formed over the CFET devices. A back side redistribution structure 490 is formed at the back side 412 of the substrate 410 by deposition and patterning operations. The redistribution structures 480, 490 electrically couple the plurality CFET devices into a functional circuit, as described with respect to FIG. 2. The redistribution structures 480, 490 further comprise a power rail at one of the front side and the back side being coupled to a conductor at the other side by the local interconnect, e.g., as described with respect to FIG. 4B.

Although the described manufacturing processes include formation of nanosheet devices in one or more embodiments, other types of devices, e.g., nanowire, FinFET, planar, or the like, are within the scopes of various embodiments. The described manufacturing processes and/or orders of operations are examples. Other manufacturing processes and/or orders of operations are within the scopes of various embodiments. In at least one embodiment, one or more advantages described herein are achievable by a layout diagram generated by the methods 900B, 900C, and/or an IC device manufactured in accordance with the method 900D.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 10:
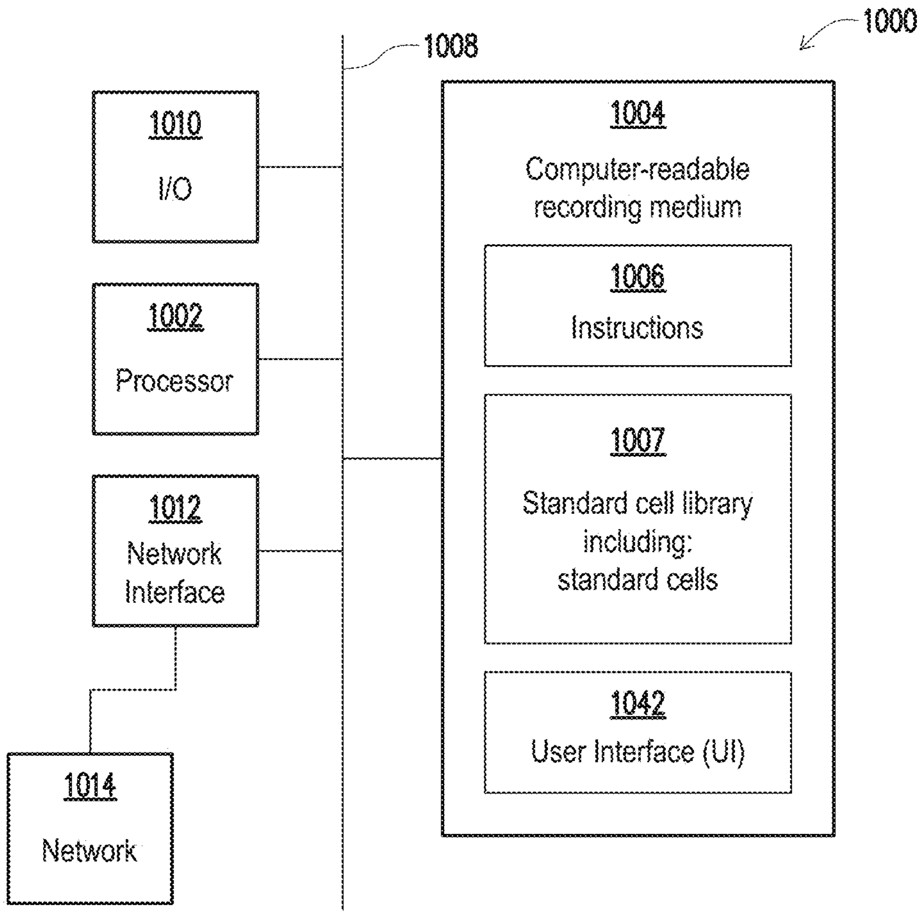
FIG. 10 is a block diagram of an electronic design automation (EDA) system in accordance with some embodiments.

FIG. 10 is a block diagram of an electronic design automation (EDA) system 1000 in accordance with some embodiments.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable recording medium 1004. Recording medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable recording medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable recording medium 1004 are capable of connecting to external elements via network 1014. Processor 1002 is configured to execute computer program code 1006 encoded in computer-readable recording medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable recording medium 1004 is an electronic, magnetic, optical, electromagnetic, infrared, and/or a semiconductor system (or apparatus or device). For example, computer-readable recording medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable recording medium 1004 includes a compact disk-read only memory (CD-ROM), a compact disk-read/write (CD-R/W), and/or a digital video disc (DVD).

In one or more embodiments, recording medium 1004 stores computer program code 1006 configured to cause system 1000 (where such execution represents (at least in part) the EDA tool) to be usable for performing a portion or all of the noted processes and/or methods. In one or more embodiments, recording medium 1004 also stores information which facilitates performing a portion or all of the noted processes and/or methods. In one or more embodiments, recording medium 1004 stores library 1007 of standard cells including such standard cells as disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable recording medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
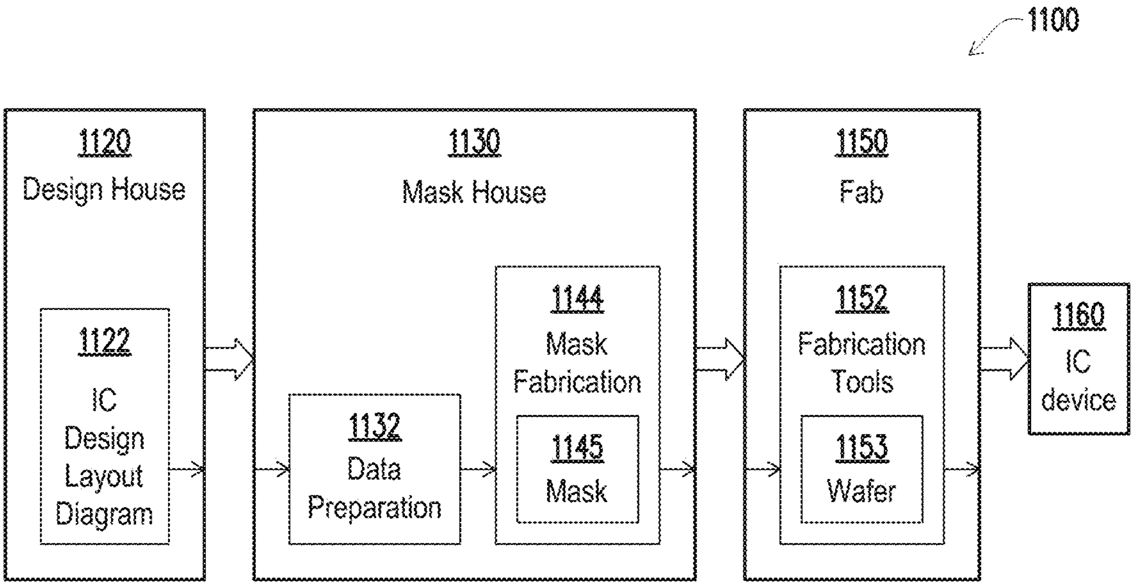
FIG. 11 is a block diagram of an IC device manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place-and-route operation. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask

1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

In some embodiments, an integrated circuit (IC) device comprises a complementary field-effect transistor (CFET) device, a power rail at a first side of the CFET device, and a conductor at a second side of the CFET device. The CFET device comprises a local interconnect. The first side is one of a front side and a back side of the CFET device. The second side is the other of the front side and the back side of the CFET device. The local interconnect of the CFET device electrically couples the power rail to the conductor.

In some embodiments, an integrated circuit (IC) device comprises a plurality of front side power rails configured to carry a first power supply voltage, a plurality of back side power rails configured to carry a second power supply voltage different from the first power supply voltage, at least one functional circuit arranged between the plurality of front side power rails and the plurality of back side power rails in a thickness direction of the IC device, and a power tap structure in the at least one functional circuit. The at least one functional circuit is electrically coupled to and powered by one or more of the plurality of front side power rails and one or more of the plurality of back side power rails. The power tap structure electrically couples a front side power rail among the plurality of front side power rails to a further back side power rail.

In some embodiments, a system comprises a processor configured to perform placing a first cell and a second cell in a layout diagram for an integrated circuit (IC) device. The first cell comprises at least one first gate region, and a first cut-gate region transverse the at least one first gate region and along a first edge of a boundary of the first cell. The second cell comprises at least one second gate region, and a second cut-gate region transverse the at least one second gate region and along a second edge of a boundary of the second cell. The second edge is placed in abutment with the first edge to form a first common edge of the first cell and the second cell in the layout diagram. The processor is further configured to perform generating a first common cut-gate region which replaces the first cut-gate region and the second cut-gate region and extends continuously across the first common edge, generating a first local interconnect within the first common cut-gate region, and storing the layout diagram in a non-transitory computer readable recording medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:

a complementary field-effect transistor (CFET) device, the CFET device comprising a local interconnect and a gate;

a power rail at a first side of the CFET device;

a conductor at a second side of the CFET device, wherein the first side is one of a front side or a back side of the CFET device, the second side is the other of the front side or the back side of the CFET device; and a front side metal layer at the front side of the CFET device, and comprising a plurality of front side conductive patterns elongated along a first direction, wherein the local interconnect of the CFET device electrically couples the power rail to the conductor, the plurality of front side conductive patterns comprises:

the power rail which is a front side power rail, and a first front side conductive pattern immediately adjacent to the front side power rail in a second direction transverse to the first direction, and the first front side conductive pattern overlaps the gate in a thickness direction transverse to both the first direction and the second direction.

2. The IC device of claim 1, further comprising:

a first via between and electrically coupling the local interconnect to the power rail; and a second via between and electrically coupling the local interconnect to the conductor.

3. The IC device of claim 2, further comprising:
a contact structure between and electrically coupling the local interconnect to the second via.

4. The IC device of claim 1, wherein
the power rail, the conductor and the local interconnect are elongated along the first direction.

5. The IC device of claim 1, wherein
the gate is arranged in a plane that intersects the local interconnect, and
the gate is electrically isolated from the local interconnect.

6. The IC device of claim 5, further comprising:
a low-k dielectric layer between and electrically isolating the gate and the local interconnect.

7. The IC device of claim 1, wherein
the CFET device further comprises active regions elongated along the first direction,
the plurality of front side conductive patterns further comprises a second front side conductive pattern immediately adjacent to the first front side conductive pattern in the second direction, and
the second front side conductive pattern overlaps the gate and the active regions of the CFET device in the thickness direction.

8. The IC device of claim 7, further comprising:
a back side metal layer comprising a plurality of back side conductive patterns elongated along the first direction, wherein
the plurality of back side conductive patterns comprises:
the conductor which is a first back side conductive pattern, and
a second back side conductive pattern immediately adjacent to the first back side conductive pattern in the second direction transverse to the first direction, and
the second back side conductive pattern overlaps the gate in the thickness direction.

9. The IC device of claim 8, wherein
the plurality of back side conductive patterns further comprises a back side power rail immediately adjacent to the second back side conductive pattern in the second direction,
the front side power rail and the back side power rail are configured to carry different power supply voltages, and
the back side power rail overlaps the gate and the active regions of the CFET device in the thickness direction.

10. An integrated circuit (IC) device, comprising:
a plurality of front side power rails configured to carry a first power supply voltage;
a plurality of back side power rails configured to carry a second power supply voltage different from the first power supply voltage;
at least one functional circuit arranged between the plurality of front side power rails and the plurality of back side power rails in a thickness direction of the IC device, the at least one functional circuit electrically coupled to and powered by one or more of the plurality of front side power rails and one or more of the plurality of back side power rails; and
a power tap structure in the at least one functional circuit, the power tap structure electrically coupling a front side power rail among the plurality of front side power rails to a further back side power rail other than the plurality of back side power rails,
wherein
the at least one functional circuit comprises a first gate having a first width in a first direction and a first length in a second direction, the first direction is transverse to the thickness direction, the second direction is transverse to the thickness direction and the first direction, and the first length is greater than the first width, and
the first gate is arranged in a first plane including the thickness direction and the second direction, and the first plane intersects the power tap structure.

11. The IC device of claim 10, further comprising:
a plurality of further back side power rails including the further back side power rail, the plurality of further back side power rails configured to carry the first power supply voltage.

12. The IC device of claim 11, wherein
the plurality of further back side power rails and the plurality of back side power rails are alternatingly arranged in a same metal layer.

13. The IC device of claim 10, wherein
the at least one functional circuit comprises a plurality of complementary field-effect transistor (CFET) devices, and
the power tap structure comprises a local interconnect of a CFET device among the plurality of CFET devices, the CFET device comprises the first gate, the local interconnect has a length in the first direction, and a width in the second direction and shorter than the length, and the first plane intersects the local interconnect.

14. The IC device of claim 10, wherein
the at least one functional circuit comprises a plurality of complementary field-effect transistor (CFET) devices, and
the power tap structure comprises a local interconnect between two immediately adjacent CFET devices among the plurality of CFET devices, one of the two immediately adjacent CFET devices comprises the first gate, the local interconnect has a length in the first direction, and a width in the second direction and shorter than the length, and the first plane intersects the local interconnect.

15. The IC device of claim 10, wherein
the at least one functional circuit further comprises a second gate immediately adjacent to the first gate in the first direction, the second gate has a second width in the first direction and a second length in the second direction, and the second length is greater than the second width,
the second gate is arranged in a second plane including the thickness direction and the second direction, the second plane does not intersect the power tap structure, and
the second length of the second gate is greater than the first length of the first gate.

16. An integrated circuit (IC) device, comprising:
at least one first complementary field-effect transistor (CFET) device in which a first top semiconductor device is stacked over a first bottom semiconductor device along a thickness direction of the IC device, the at least one first CFET device comprising:
a first active region extending along a first direction transverse to the thickness direction; and
at least one first gate extending, across the first active region, along a second direction transverse to the thickness direction and the first direction;
at least one second CFET device in which a second top semiconductor device is stacked over a second bottom semiconductor device along the thickness direction, the at least one second CFET device comprising:

a second active region spaced from the first active region along the second direction; and at least one second gate extending, across the second active region, along the second direction; and a local interconnect common to both the at least one first CFET device and the at least one second CFET device, wherein the local interconnect extends along the first direction and across both the at least one first gate and the at least one second gate.

17. The IC device of claim 16, wherein along the second direction, the local interconnect is between the at least one first gate and the at least one second gate.

18. The IC device of claim 16, wherein the at least one first gate comprises multiple first gates, the at least one second gate comprises multiple second gates, and the local interconnect extends along the first direction and across both the multiple first gates and the multiple second gates.

19. The IC device of claim 16, further comprising:

a dielectric layer between and electrically isolating the local interconnect from each of the at least one first gate and the at least one second gate.

20. The IC device of claim 19, wherein the dielectric layer surrounds the local interconnect.

* * * * *